United States Patent
Yoshizumi et al.

(10) Patent No.: US 9,006,741 B2
(45) Date of Patent: Apr. 14, 2015

(54) MEMORY DEVICE IN A PROGRAMMED STATE HAVING A MEMORY LAYER COMPRISING CONDUCTIVE NANOPARTICLES COATED WITH AN ORGANIC FILM FORMED BETWEEN TWO CONDUCTIVE LAYERS

(75) Inventors: Kensuke Yoshizumi, Kanagawa (JP); Noriko Harima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 549 days.

(21) Appl. No.: 12/018,339

(22) Filed: Jan. 23, 2008

(65) Prior Publication Data

US 2008/0185578 A1 Aug. 7, 2008

(30) Foreign Application Priority Data

Feb. 2, 2007 (JP) .................................. 2007-024860
Feb. 2, 2007 (JP) .................................. 2007-024862

(51) Int. Cl.
*H01L 27/112* (2006.01)
*G11C 13/00* (2006.01)
*H01L 27/105* (2006.01)
*H01L 23/525* (2006.01)
*B82Y 10/00* (2011.01)

(52) U.S. Cl.
CPC ........ *G11C 13/0014* (2013.01); *H01L 27/1052* (2013.01); *H01L 27/11206* (2013.01); *H01L 23/5252* (2013.01); *B82Y 10/00* (2013.01); *G11C 2213/79* (2013.01)

(58) Field of Classification Search
CPC ..................... H01L 27/1052; H01L 27/11206; H01L 27/11213; H01L 2924/145
USPC .............................. 257/50, 529, 530, E23.147
See application file for complete search history.

(56) References Cited

U.S. PATENT DOCUMENTS

| | | | |
|---|---|---|---|
| 5,583,819 A | 12/1996 | Roesner et al. | |
| 5,759,876 A * | 6/1998 | Singlevich et al. | 438/131 |
| 5,834,824 A * | 11/1998 | Shepherd et al. | 257/530 |
| 6,051,851 A | 4/2000 | Ohmi et al. | |
| 6,534,841 B1 | 3/2003 | Van Brocklin et al. | |
| 6,584,029 B2 | 6/2003 | Tran et al. | |
| 6,807,079 B2 * | 10/2004 | Mei et al. | 365/96 |
| 7,405,167 B2 | 7/2008 | Kang et al. | |
| 7,539,038 B2 | 5/2009 | Lee et al. | |
| 7,622,736 B2 * | 11/2009 | Moriya et al. | 257/48 |
| 7,681,801 B2 * | 3/2010 | Iwata | 235/487 |
| 7,714,408 B2 * | 5/2010 | Tokunaga | 257/530 |

(Continued)

FOREIGN PATENT DOCUMENTS

EP 1 571 186 A1 9/2005
JP 2001-237380 8/2001

(Continued)

*Primary Examiner* — Anh Mai
(74) *Attorney, Agent, or Firm* — Husch Blackwell LLP

(57) ABSTRACT

A memory device is provided, which includes a first conductive layer, a second conductive layer, and a memory layer interposed between the first conductive layer and the second conductive layer. The memory layer includes a first portion and a second portion, each of which includes at least a nanoparticle. The nanoparticle includes a conductive material coated with an organic film. The first portion is in contact with the first conductive layer and the second conductive layer, and a side surface of the first portion is surrounded by the second portion.

17 Claims, 25 Drawing Sheets

(56) References Cited

U.S. PATENT DOCUMENTS

| | | | |
|---|---|---|---|
| 7,781,758 B2 * | 8/2010 | Abe et al. | 257/40 |
| 7,791,066 B2 | 9/2010 | Yamazaki | |
| 7,956,352 B2 * | 6/2011 | Yukawa et al. | 257/40 |
| 8,174,006 B2 | 5/2012 | Yamazaki | |
| 2004/0253368 A1 | 12/2004 | Tokuda | |
| 2005/0095356 A1 | 5/2005 | Nakamura et al. | |
| 2005/0189520 A1 | 9/2005 | Okada et al. | |
| 2005/0196710 A1 | 9/2005 | Shiroguchi | |
| 2005/0274949 A1 | 12/2005 | Yamazaki et al. | |
| 2006/0028895 A1 | 2/2006 | Taussig et al. | |
| 2006/0038174 A1 | 2/2006 | Maekawa | |
| 2006/0115983 A1 | 6/2006 | Fujii et al. | |
| 2006/0121745 A1 | 6/2006 | Fujii | |
| 2006/0134918 A1 | 6/2006 | Fujii et al. | |
| 2006/0157105 A1 | 7/2006 | Nishi et al. | |
| 2006/0158482 A1 | 7/2006 | Nakamura et al. | |
| 2006/0166411 A1 | 7/2006 | Morisue et al. | |
| 2006/0169973 A1 | 8/2006 | Isa et al. | |
| 2006/0170111 A1 | 8/2006 | Isa et al. | |
| 2006/0175648 A1 * | 8/2006 | Asami | 257/296 |
| 2006/0220252 A1 * | 10/2006 | Yukawa et al. | 257/758 |
| 2006/0263634 A1 * | 11/2006 | Yamazaki | 428/690 |
| 2007/0051952 A1 | 3/2007 | Yamazaki et al. | |
| 2007/0051958 A1 | 3/2007 | Yamazaki et al. | |
| 2007/0054582 A1 | 3/2007 | Tokuda | |
| 2007/0196962 A1 | 8/2007 | Morisue et al. | |
| 2008/0042288 A1 | 2/2008 | Yamazaki et al. | |
| 2008/0087888 A1 | 4/2008 | Morisue | |
| 2008/0087982 A1 | 4/2008 | Fujii | |
| 2008/0099759 A1 | 5/2008 | Fujii et al. | |
| 2008/0099878 A1 | 5/2008 | Yukawa et al. | |
| 2008/0105875 A1 | 5/2008 | Maekawa et al. | |
| 2008/0205132 A1 * | 8/2008 | Hirakata | 365/182 |
| 2008/0315428 A1 | 12/2008 | Fujii | |
| 2009/0317968 A1 * | 12/2009 | Nagata | 438/600 |
| 2010/0055896 A1 * | 3/2010 | Abe et al. | 438/623 |
| 2011/0031469 A1 * | 2/2011 | Yamazaki et al. | 257/5 |

FOREIGN PATENT DOCUMENTS

| | | |
|---|---|---|
| JP | 2002-26277 | 1/2002 |
| JP | 2005-116682 | 4/2005 |
| JP | 2005-247905 | 9/2005 |
| JP | 2006-186363 A | 7/2006 |
| JP | 2006-352104 | 12/2006 |
| KR | 2006-0100581 A | 9/2006 |

* cited by examiner

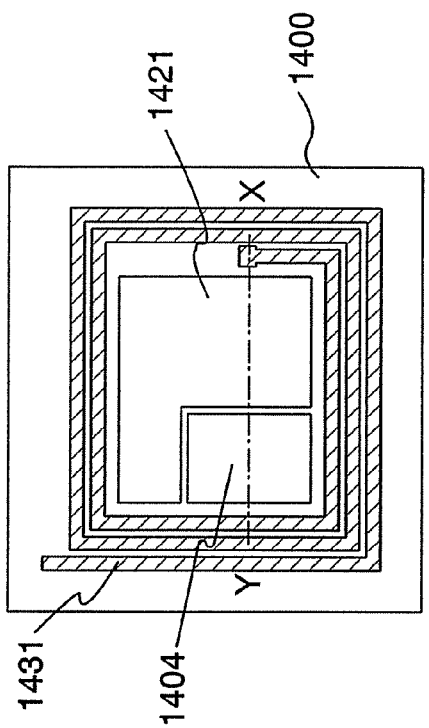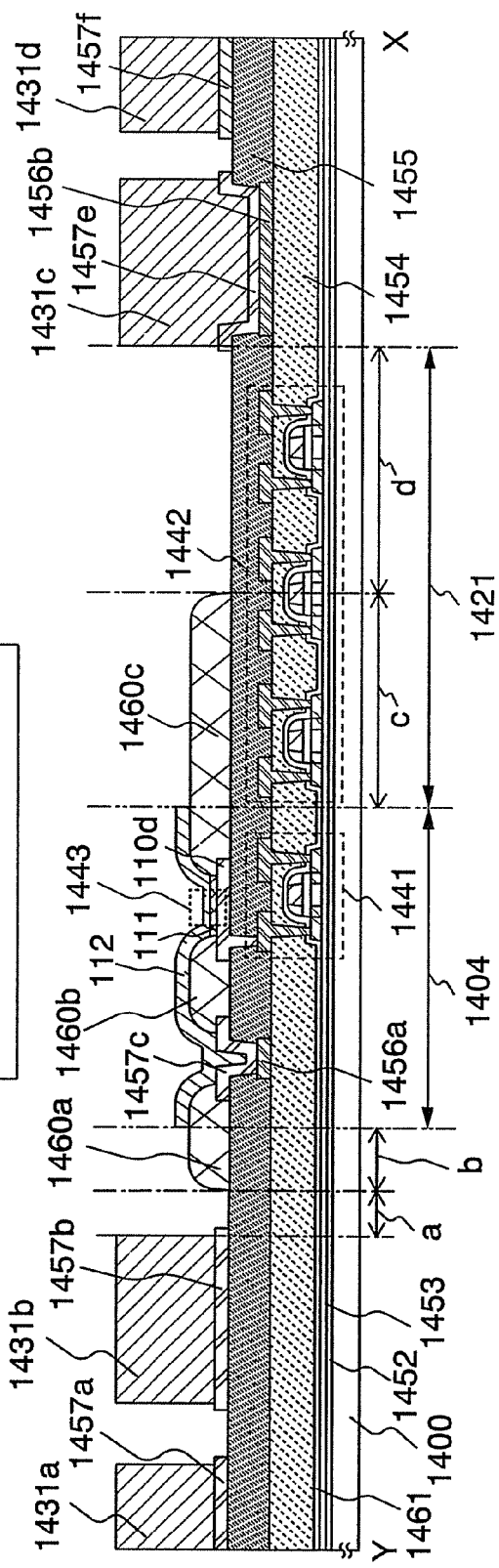
FIG. 16A
FIG. 16B

MEMORY DEVICE IN A PROGRAMMED STATE HAVING A MEMORY LAYER COMPRISING CONDUCTIVE NANOPARTICLES COATED WITH AN ORGANIC FILM FORMED BETWEEN TWO CONDUCTIVE LAYERS

BACKGROUND OF THE INVENTION

1. Field of the Invention

The present invention relates to a memory element and a semiconductor device having the memory element.

2. Description of the Related Art

In recent years, a semiconductor device having various functions, in which a plurality of circuits is integrated over an insulating surface, has been developed. In addition, a semiconductor device capable of transmission and reception of data, which is provided with an antenna and operates with electric energy into which an electric wave received by the antenna has been converted, is developed. Such a semiconductor device is referred to as a wireless chip (also referred to as an ID tag, an IC tag, an IC chip, an RF (radio frequency) tag, a wireless tag, an electronic tag, or an RFID (radio frequency identification)), and has already been introduced into some markets.

Most of such semiconductor devices that have already been put into practical use generally have an antenna and a circuit (also referred to as an IC (integrated circuit) chip) using a semiconductor substrate such as a silicon substrate, and the IC chip includes a memory circuit (also referred to as a memory), a control circuit, and the like. In particular, it is possible to provide a semiconductor device with high added value providing higher performance by being provided with a memory circuit which can store much data. However, although silicon substrates are expensive, such semiconductor devices are required to be manufactured inexpensively. This is because small semiconductor devices such as wireless chips are expected to be in demand as semi-disposable products. As a result, in recent years, an organic thin film transistor (hereinafter, also referred to as an "organic TFT"), an organic memory, and the like using organic compounds for a control circuit, a memory circuit, and the like have been actively developed (for example, see Reference 1: Japanese Published Patent Application No. 2002-26277).

SUMMARY OF THE INVENTION

A memory element that functions as a memory portion of an organic memory is formed by providing an organic compound layer between a pair of electrodes, and data is written to the memory element utilizing change of electrical characteristics such as a resistance value which is caused by voltage application. Such an organic compound layer is generally formed by a vapor deposition method.

When an organic compound layer is formed by a vapor deposition method, only part of the vaporized organic compound is used, which leads to low efficiency in the use of materials. There are also problems in that for example, since materials which are not to be used are also vaporized, a large amount of energy is consumed in a manufacturing process.

In addition, when an organic memory is manufactured by a vapor deposition method using a metal mask, an alignment step for aligning the metal mask is required. Accordingly, yield of products would drop due to nonconformity of the alignment operation.

In response, it is an object of the present invention to provide a memory element which can be manufactured simply and inexpensively with high yield. Further, it is another object of the present invention to provide a semiconductor device having the memory element.

In the present invention, a memory element has a structure at least including a first conductive layer, a second conductive layer, and a memory layer interposed between the first conductive layer and the second conductive layer. The memory layer is formed from nanoparticles of a conductive material each of which is coated with an organic thin film, and the memory layer can be formed by a wet phase method. Typically, a droplet discharge method, a printing method, or the like can be given as a wet phase method, and a droplet discharge method is preferably employed to form the memory layer. For example, a composition in which nanoparticles of a conductive material each of which is coated with an organic thin film are dispersed in a solvent is discharged (ejected) as droplets, and the solvent is dried to be vaporized to form the memory layer. Accordingly, efficiency in the use of materials can be improved, and a memory element can be formed simply. In addition, yield is also improved, so that the memory element can be provided inexpensively.

Note that organic thin films coating nanoparticles correspond to a dispersant having functions of preventing nanoparticles from flocculating in a discharged composition (also referred to as discharge material) and stably dispersing the particles, and for example, a surfactant, a material which can form a coordinate bond with the conductive material of the nanoparticles, or the like is used. Further, the discharge material may contain a material used for forming the nanoparticles (for example, a reducing agent), a binder, a plasticizer, a silane coupling agent, or the like besides conductive nanoparticles, a dispersant, and a solvent. Therefore, the organic thin films coating nanoparticles include at least a dispersant, for example, a surfactant, a material which can form a coordinate bond with the conductive material in the nanoparticles, or the like, and may further contain a material used for forming the nanoparticles, a binder, a plasticizer, a silane coupling agent, or the like.

When voltage is applied to such a memory element, electrical characteristics of the memory element are changed, whereby data is written to the memory element. For example, a resistance value may be given as an example of electrical characteristics. The first conductive layer and the second conductive layer, which form a pair, are electrically connected to each other with a conductive portion formed by welding of nanoparticles of a conductive material interposed therebetween, that is, the first conductive layer and the second conductive layer are short-circuited (also referred to as "shorted"), at the time of writing, whereby a resistance value is changed. Writing is performed with the use of the change in resistance value.

The first conductive layer of the memory element to which data has not been written yet is connected to the second conductive layer, with a plurality of insulating films formed of the organic thin films and conductive layers of a conductive material of nanoparticles alternately interposed therebetween. That is, it can be said that the memory element has a structure in which the first conductive layer and the second conductive layer are connected to each other, with a plurality of capacitor elements connected to each other in multiple stages interposed therebetween. Therefore, writing by applying voltage can be described as being performed by breaking the capacitor element. In this case, the insulating layer has a structure provided with at least one more layer than the third conductive layer.

Note that in this specification, write voltage is not limited in particular as long as electrical characteristics of a memory element are changed by applying the voltage between the first conductive layer and the second conductive layer. The minimum value of the applied voltage required to significantly change electrical characteristics of the memory element is defined as write voltage in this specification. Further, read voltage is an applied voltage used for reading difference in electrical characteristics between an element to which data has not been written yet and an element to which data has been written, and is not limited in particular as long as the voltage does not change by electrical characteristics of the memory element.

Further, the first conductive layer and the second conductive layer may also be referred to as electrodes.

One feature of the present invention is a memory element including a first conductive layer, a second conductive layer, and a memory layer interposed between the first conductive layer and the second conductive layer, where the memory layer includes a portion (also referred to as a second portion) formed from nanoparticles of a conductive material each of which is coated with an organic thin film, and a conductive portion (also referred to as a first portion) formed by welding of the nanopartiles. In the memory element, the first conductive layer and the second conductive layer are electrically connected to each other with the conductive portion interposed therebetween.

One aspect of the present invention is a memory element including a first conductive layer, a second conductive layer, and a memory layer interposed between the first conductive layer and the second conductive layer, where the memory layer includes a portion formed from nanoparticles of a conductive material each of which is coated with an organic thin film, a conductive portion formed by welding of the nanopartiles, and a space formed between a side surface of the conductive portion and the portion formed from nanoparticles. In the memory element, the first conductive layer and the second conductive layer are electrically connected to each other with the conductive portion interposed therebetween.

Another aspect of the present invention is a memory element including a first conductive layer, a second conductive layer, and a memory layer interposed between the first conductive layer and the second conductive layer, where the memory layer includes a portion formed from nanoparticles of a conductive material each of which is coated with an organic thin film, a space formed inside the portion, and a conductive portion, which is formed by welding of nanoparticles and which electrically connects the first conductive layer and the second conductive layer, inside the space.

Another aspect of the present invention is a memory element including a first conductive layer, a second conductive layer, and a memory layer interposed between the first conductive layer and the second conductive layer, where the memory layer includes a portion formed from nanoparticles of a conductive material each of which is coated with an organic thin film, a conductive portion formed by welding of nanoparticles, and a space. In the memory element, the first conductive layer and the second conductive layer are electrically connected to each other with the conductive portion interposed therebetween, and a side surface of the conductive portion is surrounded by the portion formed from nanoparticles with the space interposed therebetween.

In the above structures, an insulating layer or a semiconductor layer may be provided between the memory layer and at least one of the first conductive layer and the second conductive layer.

Further, for example, the memory layer is formed by a droplet discharge method. The insulating layer and the semiconductor layer may also be formed by a droplet discharge method. In that case, the insulating layer is preferably formed from an insulating organic compound.

Another aspect of the present invention may be a semiconductor device in which a plurality of memory elements is arranged in matrix. Note that each of the plurality of memory elements may be connected to a thin film transistor.

According to the present invention, a memory element with excellent performance and reliability and a semiconductor device having the memory element can be manufactured simply with high yield. Thus, a memory element and a semiconductor device with excellent performance and reliability can be provided inexpensively.

BRIEF DESCRIPTION OF THE DRAWINGS

In the accompanying drawings:

FIGS. 16A and 16B are views illustrating a semiconductor device of the present invention;

DETAILED DESCRIPTION OF THE INVENTION

Figure 1:
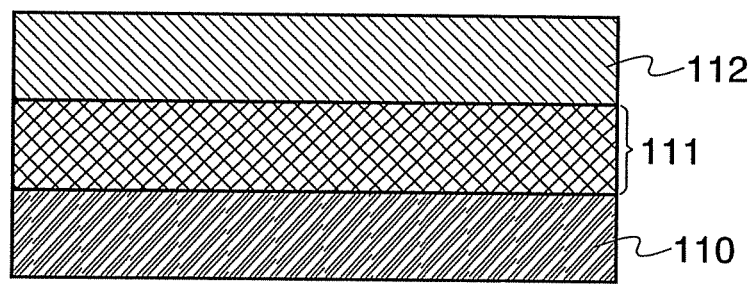
FIG. 1 is a view illustrating a structural example of a memory element of the present invention.

Embodiment modes and an embodiment of the present invention will be explained below with reference to the accompanied drawings. However, the present invention is not limited to explanation to be given below, and it is to be easily understood that various changes and modifications in modes and details thereof will be apparent to those skilled in the art without departing from the meaning and the scope of the present invention. Therefore, the present invention should not be interpreted as being limited to the description of the embodiment modes and embodiment to be given below. Note that, in a structure of the present invention which will be explained below, like reference numerals may be used for like portions throughout the drawings.

Embodiment Mode 1

Figure 24:
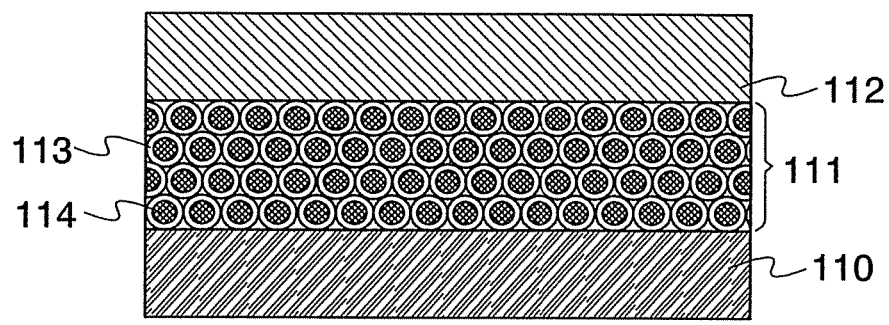
FIG. 24 is a schematic view of a memory element of the present invention.

A structural example of a memory element of the present invention is described with reference to FIG. 1. A memory element shown in FIG. 1 includes a first conductive layer 110, a second conductive layer 112, and a memory layer 111 interposed between the first conductive layer 110 and the second conductive layer 112. The memory layer 111 is formed from nanoparticles of a conductive material each of which is coated with an organic thin film. FIG. 24 is a schematic view of a memory element, in which the organic thin film is denoted by reference numeral 113 and the nanoparticle of a conductive material is denoted by reference numeral 114. As shown in FIG. 24, the second conductive layer 112 is provided over the first conductive layer 110, with a region in which an insulating film formed of the organic thin film 113 and the nanoparticle 114 of a conductive film are alternately disposed interposed therebetween. That is, the first conductive layer 110 is connected to the second conductive layer 112, with a plurality of insulating films formed of the organic thin films 113 and a plurality of conductive layers of a conductive material of the nanoparticle 114 alternately interposed therebetween. In other words, it can be said that the first conductive layer and the second conductive layer are connected to each other with capacitor elements connected to each other in multiple stages interposed therebetween.

Figure 2A:
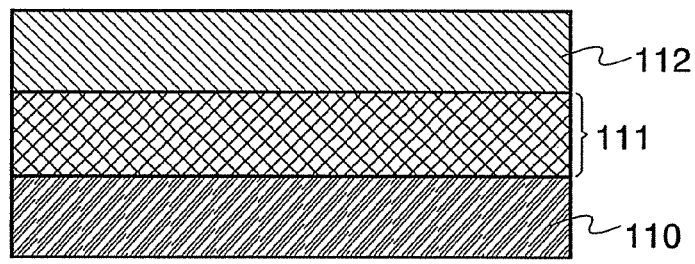
FIGS. 2A to 2C are views illustrating an operation mechanism of a memory element of the present invention.
Figure 2B:
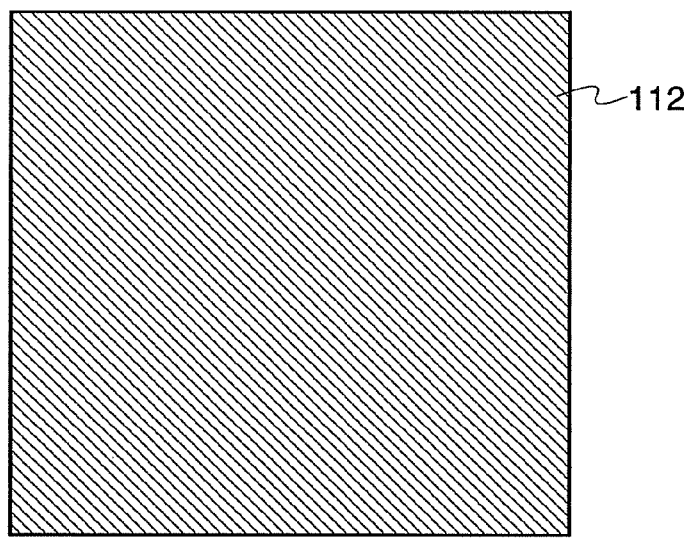
Figure 2C:
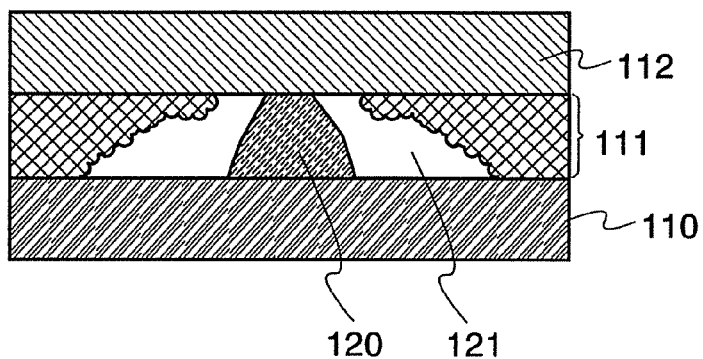

First, an operation mechanism of a memory element of the present invention will be described with reference to FIGS. 2A to 2C. FIG. 2A is a cross-sectional view of a memory element to which data has not been written yet, and FIGS. 2B to 2C are a top view and a cross-sectional view, respectively, of the memory element to which data has been written. The memory layer 111 of the memory element to which voltage has not been applied, that is, to which data has not been written yet, is formed from nanoparticles of a conductive material each of which is coated with an organic thin film. Accordingly, the memory layer 111 is not conductive, and a resistance value of the memory element is high. When voltage is applied between the first conductive layer 110 and the second conductive layer 112 of such a memory element, a small amount of current flows through the memory layer 111, so that Joule heat is generated. The Joule heat breaks the organic thin films, and nanoparticles of a conductive material contact and weld to each other. Thus, the resistance of the memory layer 111 is lowered, and as shown in FIG. 2C, the first conductive layer 110 and the second conductive layer 112 are electrically connected to each other with a conductive portion 120 formed by the welding interposed therebetween, and at the end the memory element is shorted. As described above, the resistance value of the memory element is changed when voltage is applied.

With such an operation mechanism described above, data is written with the use of change in resistance value of the memory element due to voltage application.

The conductive portion 120 formed in the memory layer 111 of the memory element to which data has been written becomes columnar, subulate, or spherical in shape. Needless to say, the shape of the conductive portion 120 is not limited to the shapes described above, and the shape thereof may be any as long as the conductive portion 120 has a function of electrically connecting the first conductive layer 110 and the second conductive layer 112. Further, the cross-sectional shape of the conductive portion is not limited to be bilaterally symmetrical because the conductive portion 120 is formed by welding of nanoparticles of a conductive material, and the cross section thereof may have an irregular shape in some cases. Furthermore, at least one conductive portion 120 is formed in the memory layer 111, and the place of the conductive portion 120 is not limited in particular.

In addition, a space 121 is formed in the periphery of the conductive portion 120. The space 121 is formed because an occupied area of the conductive portion 120 formed by breaking and welding of the organic thin film is smaller than an occupied area of nanoparticles which had not been welded yet. The memory layer 111 does not shrink because the space 121 is formed, and accordingly, the second conductive layer 112 is not stressed. Therefore, the second conductive layer 112 is not deformed, so that a certain distance is kept between the first conductive layer 110 and the second conductive layer 112 even after writing data to the memory element. Accordingly, for example in the case where another layer is provided over the second conductive layer 112, or the like, it is not necessary to concern about peeling of the layer, or the like. The shape of the space 121 roughly depends on the shape of the conductive portion 120 as well as a material used for the memory layer 111.

Note that there is a case where a conductive portion is formed which is electrically connected to the first conductive layer 110, though the conductive portion does not electrically connect the first conductive layer 110 and the second conductive layer 112. Accordingly, besides the structure described above, the memory layer 111 may have a conductive portion electrically connected only to the first conductive layer 110. The formation of the conductive portion is accompanied by formation of a space in a region of the memory layer 111 where a large amount of nanoparticles is welded. Therefore, the memory layer 111 may further have a space in the periphery of the conductive portion. It is needless to say that the shapes and the quantities of the conductive portion and the space are not limited in particular.

Figure 25A:
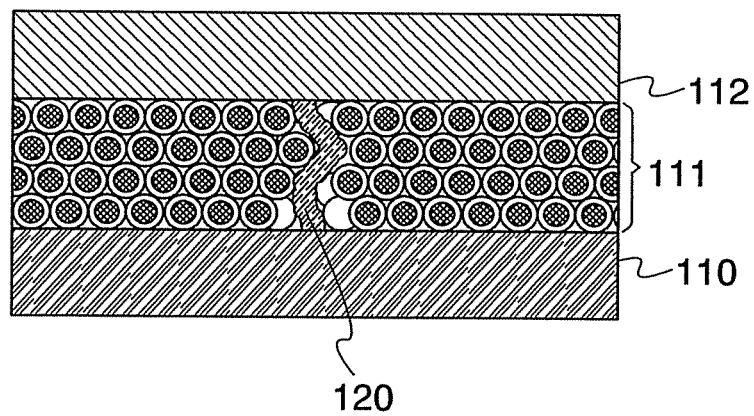
FIGS. 25A and 25B are views each showing a structural example of a memory element to which data has been written.
Figure 25B:
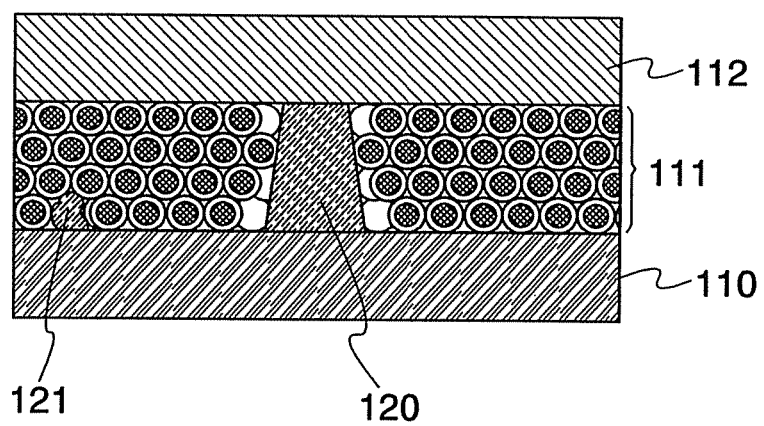

Note that as shown in FIG. 25B, there is a case where a space is not formed in the periphery of the conductive portion 120. Therefore, it is not necessary that the memory layer 111 of the memory element to which data has been written has a space. Further, as described above, there may be a case where the conductive portion 120 has an irregular shape in its cross section. For example, a conductive portion 120 as shown in FIG. 25A is formed, and the shape thereof depends on the amount of welded nanoparticles.

Figure 3A:
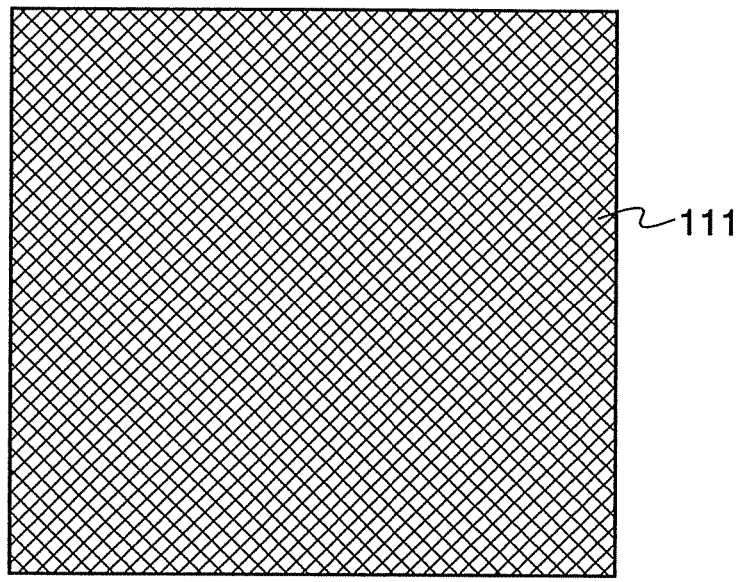
FIGS. 3A and 3B are diagrams showing an example of a top view of a memory layer of a memory element to which data has not been written yet and a memory layer of a memory element to which data has been written, respectively.
Figure 3B:
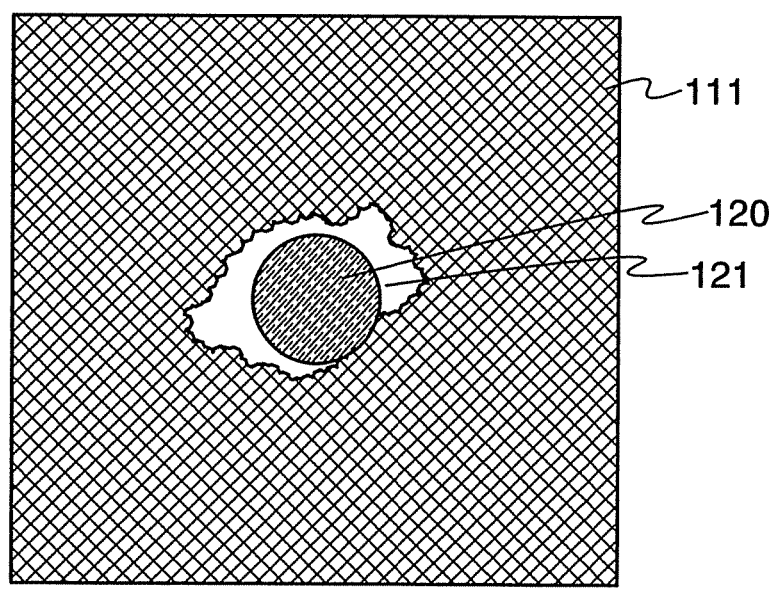

FIGS. 3A and 3B show an example of top views of the memory layer 111 of the memory element to which data has not been written yet and the memory layer 111 thereof to which data has been written, respectively. The top views in FIGS. 3A and 3B each show a cross section taken along a plane at half the thickness of the memory layer 111. FIG. 3A shows the memory layer 111 of the memory element to which data has not been written yet, and FIG. 3B shows the memory layer 111 of the memory element to which data has been written.

Next, a material which can be used for each layer is described. A single layer or a stack of metal, alloy, a compound, or the like which are highly conductive can be used for the first conductive layer 110 and the second conductive layer 112 in a memory element of the present invention.

For example, besides a metal such as gold (Au), silver (Ag), platinum (Pt), nickel (Ni), tungsten (W), chromium (Cr), molybdenum (Mo), iron (Fe), cobalt (Co), copper (Cu), palladium (Pd), aluminum (Al), manganese (Mn), titanium (Ti), tantalum (Ta); and a nitride of such a metal material (for example, titanium nitride, tungsten nitride, or molybdenum nitride), a metal belonging to Group 1 or 2 of the periodic table, that is, an alkali metal such as lithium (Li) or cesium (Cs), an alkaline earth metal such as magnesium (Mg), calcium (Ca), or strontium (Sr); an alloy containing any of them (for example, Mg:Ag, Al:Li); or the like can be used. Further, a rare earth metal such as europium (Er) or ytterbium (Yb); an alloy including them; or the like may be used. Alternatively, indium tin oxide (hereinafter, referred to as ITO), indium tin oxide containing silicon, indium oxide (abbreviated to IZO) containing 2% to 20% [wt %] of zinc oxide (ZnO), or the like, each of which is used as a transparent conductive film, can be used.

Note that the first conductive layer 110 is formed by a vapor deposition method, a sputtering method, a CVD method, a printing method, an electrolytic plating method, an electroless plating method, a spin coating method, or the like.

The second conductive layer 112 can be formed by a vapor deposition method, a sputtering method, a CVD method, a printing method, or a spin coating method.

The memory layer 111 is formed from nanoparticles of a conductive material each of which is coated with an organic thin film. The memory layer 111 is formed by a droplet discharge method. A droplet discharge method is a method by which a pattern is formed by discharging droplets containing a predetermined substance from minute openings. Here, a composition in which nanoparticles of a conductive material each of which is coated with an organic thin film are dispersed in a solvent is discharged (ejected) as droplets, and dried so that the solvent is vaporized, thereby forming the memory layer 111. The thickness of the memory layer 111 is not limited in particular; however, the thickness is preferably greater than or equal to 1 nm and less than or equal to 250 nm. Note that if the thickness of the memory layer 111 is excessively thick, when voltage is applied, behaviors of memory elements may vary; therefore, the thickness should be set in consideration of the above. As to a memory element of the present invention, write voltage can be reduced as the thickness of the memory layer 111 is smaller.

A conductive material for forming nanoparticles may be a metal element selected from gold (Au), silver (Ag), platinum (Pt), nickel (Ni), copper (Cu), palladium (Pd), tantalum (Ta), iridium (Ir), rhodium (Rh), tungsten (W), aluminum (Al), iron (Fe), zinc (Zn), tin (Sn), titanium (Ti), indium (In), or the like, or an alloy material containing such an element as a main component. Further, a metal sulfide of cadmium (Cd) or zinc (Zn), an oxide of germanium (Ge), silicon (Si), zirconium (Zr), barium (Ba), or the metal element described above, or one or more halides may be mixed. Further, ITO, indium tin oxide containing silicon, IZO, or the like, each of which is used as a transparent conductive film, can be used for a conductive material.

Note that in the case where two or more kinds of elements or compounds are used as conductive materials, the mixture form is not limited in particular, for example, they may be uniform, or any one of them may be concentrated in the core portion.

The grain diameter of nanoparticles is greater than or equal to 1 nm and less than or equal to 200 nm, preferably greater than or equal to 1 nm and less than or equal to 100 nm, and grain diameters of the nanoparticles included in the discharge material are preferably uniform.

The nanoparticles may be formed by any of a gas phase method, a liquid phase method, or a solid phase method, and a manufacturing method thereof is not particularly limited.

Note that when voltage is applied, voids may be generated between particles depending on the kind of the conductive material forming the nanoparticles. This is because the crystal growth of the conductive material has proceeded very rapidly. The generation of such voids can be suppressed by setting voltage applied to the memory element lower or using an alloy material for the nanoparticles. Accordingly, a memory element with higher reliability can be obtained.

The organic thin films coating the nanoparticles correspond to a dispersant having functions of preventing nanoparticles from flocculating in a solvent and stably dispersing the particles. Accordingly, the compound forming the organic thin films is formed of a surfactant, a material which can form a coordinate bond with a metal element contained in the conductive material, or the like. Here, as the material forming a coordinate bond with the metal element, a material having a lone electron-pair such as an amino group, a thiol group (—SH), a sulfanediyl group (—S—), a hydroxy group (—OH), an oxy group (—O—), a carboxyl group (—COOH), a cyano group (—CN), or the like which are on an atom of nitrogen, sulfur, oxygen, or the like can be used. For example, hydroxyamines such as ethanolamine, an amine-based compound such as polyethyleneimine or polyvinylpyrrolidone, alcohols such as polyvinyl alcohol, alkanethiols, dithiols, glycols such as ethylene glycol, diethylene glycol, or polyethylene glycol, polyacrylic acid, carboxymethylcellulose, or the like can be used. Further, as a surfactant, for example, an anionic surfactant such as bis(2-ethylhexyl)sulfosuccinic acid or sodium dodecylbenzenesulfonate, a nonionic surfactant such as alkyl ester which is polyalkyl glycol, alkyl phenyl ether, or the like, a fluorosurfactant, a copolymer having polyethyleneimine and polyethylene oxide, or the like can be used. Note that when a dispersant is 30 wt % or more with respect to nanoparticles, the viscosity of the discharge material becomes high, so that 1.0 wt % to 30 wt % is preferable.

Nanoparticles of a conductive material each of which is coated with an organic thin film as described above are dispersed in a solvent and discharged. For the solvent, water or an organic solvent can be used, and an organic solvent may be either a water-soluble organic solvent or a water-insoluble organic solvent. For example, as a water-soluble organic solvent, alcohols such as methanol, ethanol, propanol, butyl alcohol, glycerin, dipropylene glycol, or ethylene glycol, ketones such as acetone or methyl ethyl ketone, glycol ethers such as ethylene glycol monomethyl ether, ethylene glycol monoethyl ether, ethylene glycol monobutyl ether, or diethylene glycol monobutyl ether, a water-soluble nitrogen containing organic compound such as 2-pyrrolidone or N-methyl pyrrolidone, ethyl acetate, or the like can be used. Further, as a water-insoluble organic solvent, alkanes such as octane, nonan, or decane, cycloalkane, aromatics such as toluene, xylene, benzene, or dichlorobenzene, or the like can be used. Naturally, not only one solvent is necessarily used but a mixture of a plurality of solvents may be used as long as phase separation does not occur between the solvents.

Figure 4:
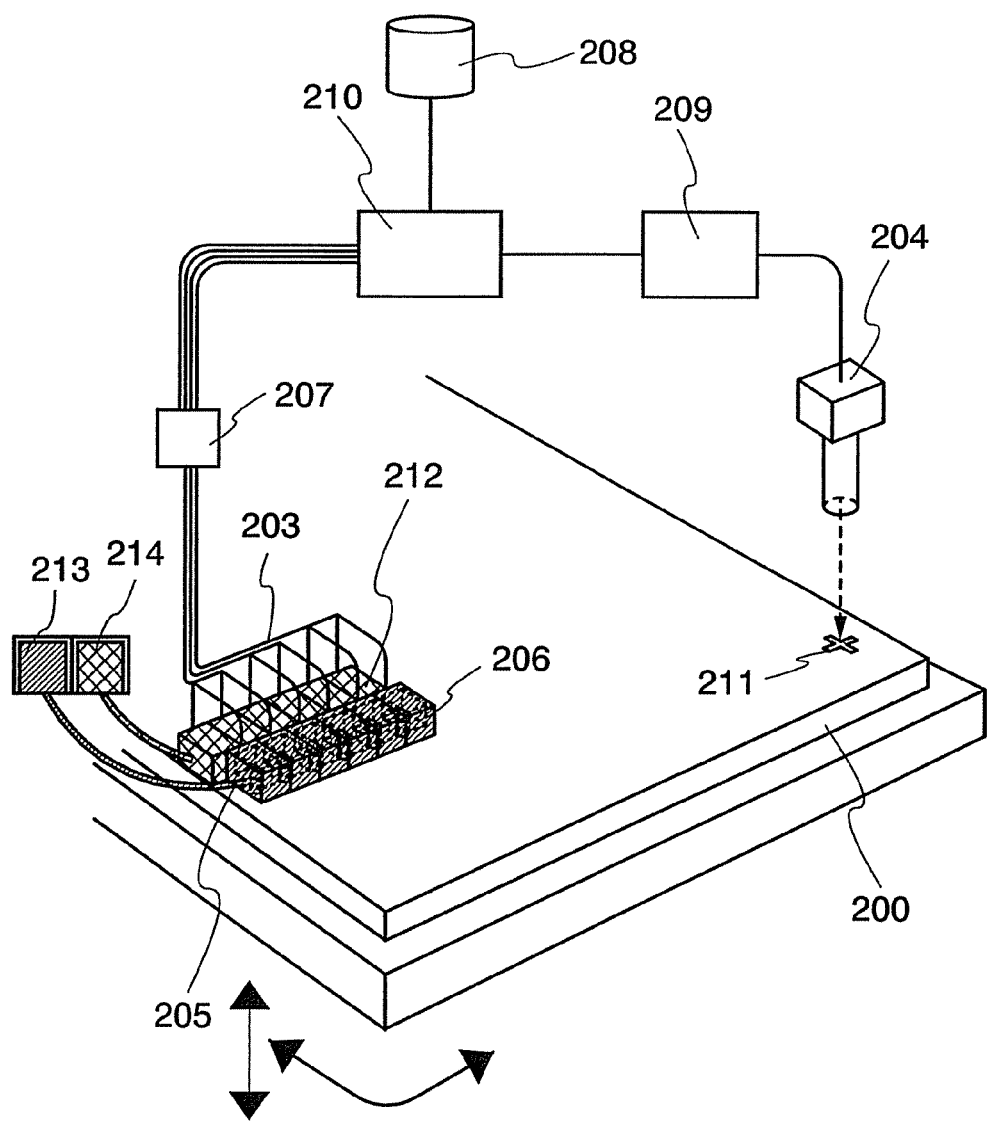
FIG. 4 is a diagram showing one mode of a droplet discharging apparatus.

Next, one mode of a droplet discharging apparatus used for a droplet discharge method is shown in FIG. 4. Each of heads 205 and 212 of a droplet discharge means 203 is connected to a control means 207, and this control means 207 is controlled by a computer 210, so that a preprogrammed pattern can be drawn. The drawing timing may be determined, for example, based on a marker 211 that is formed over a substrate 200 over which memory elements are provided. Alternatively, the edge of the substrate 200 may be used as the reference. The reference is detected by an imaging means 204, and converted into a digital signal by an image processing means 209. Then, the digital signal is recognized by the computer 210 and a control signal is generated, and the control signal is transmitted to the control means 207. An image sensor or the like using a charge coupled device (CCD) or a complementary metal oxide semiconductor can be used as the imaging means 204. Information about a pattern to be formed over the substrate 200 is stored in a storage medium 208, and the control signal is transmitted to the control means 207 based on the information, so that each of the heads 205 and 212 of the droplet discharge means 203 is individually controlled. The heads 205 and 212 are supplied with a material to be discharged, from material supply sources 213 and 214 respectively through pipes.

The head 205 has an internal structure which includes spaces filled with a liquid material as indicated by dotted lines 206 and nozzles which are discharge openings. Although not shown in the figure here, the head 212 has an internal structure similar to that of the head 205. When the heads 205 and 212 have different nozzle sizes from each other, different materials with different widths can be discharged simultaneously. Needless to say, the same material can be discharged with different widths simultaneously.

When a large substrate is used, the heads 205 and 212 can be freely scanned in directions indicated by the arrows in the figure, and a drawing region can be freely set. Therefore, a plurality of the same patterns can be drawn on one substrate. Further, a drawing region may be freely set by moving a stage. Naturally, the heads and the stage may be moved simultaneously.

Note that the viscosity of a material to be discharged is preferably 20 mPa·s or less so that the material can be discharged from the nozzles smoothly. Further, the surface tension (energy) of the material to be discharged is preferably 40 mN/m or less. Note that, the viscosity of the discharge material, or the like may be adjusted as appropriate in accordance with the solvent used, usage, or the like. For example, the viscosity of a discharge material in which nanoparticles of gold or silver are dispersed in a solvent may preferably be greater than or equal to 5 mPa·s and less than or equal to 20 mPa·s.

Using such a droplet discharging apparatus, a discharge material in which nanoparticles of a conductive material each of which is coated with an organic thin film are dispersed in a solvent is discharged onto a desired position, and is dried after that so that the solvent is vaporized. Although the drying condition varies depending on the solvent, for example, in the case where propanol is used for the solvent, the drying may be performed at 100° C. for approximately 5 minutes. Note that the substrate provided with the first conductive layer 110 may be heated at the time of discharging thereby reducing time required for drying.

Note that the discharge material may contain a material used for forming the nanoparticles, a binder, a plasticizer, a silane coupling agent, or the like besides a conductive material, a dispersant, and a solvent. As a binder, a thermosetting resin, for example, an organic resin such as polyimide, acrylic, a novolac resin, a melamine resin, a phenol resin, an epoxy resin, a silicone resin, a furan resin, or a diallyl phthalate resin can be used. Note that a binder can suppress uneven adhesion between nanoparticles by force of contraction of a thermosetting resin. Further, such a resin makes it also possible to adjust the viscosity of the discharge material.

Therefore, an organic thin film each coating the nanoparticle forming the memory layer 111 may contain a solvent, a material used for forming the nanoparticles (for example, a reducing agent), a binder, a plasticizer, a silane coupling agent, or the like besides a dispersant. Further, there are some cases where a solvent remains in the organic thin films. As described above, the organic thin films included in the memory layer 111 includes at least a surfactant, a material which can form a coordinate bond with the metal element in the nanoparticles, or the like, and may further contain a material used for forming the nanoparticles, a binder, a plasticizer, a silane coupling agent, or the like.

Note that the case of forming the memory layer 111 using a droplet discharge method is described above; however, it may be formed by a printing method typified by screen printing by increasing the viscosity of the discharge material. Even in the case of using a printing method, the efficiency in the use of materials can be improved as compared with the case of using a vapor deposition method or the like, and a memory layer 111 can be formed more simply. However, a method for forming the memory layer 111 is not limited to these, and the memory layer 111 can be formed by another wet method.

Further, the first conductive layer 110 and the second conductive layer 112 may also be formed by a droplet discharge method.

As described above, a memory element of the present invention can be manufactured simply with high yield. In addition, since it is impossible to erase data of a memory element where writing is once performed in the memory element of the present invention, it is possible to prevent forgery by rewriting. Therefore, it becomes possible to manufacture a memory element superior in terms of performance and reliability at a low cost.

As for the voltage which is applied to the memory element of the present invention, a higher voltage may be applied to the first conductive layer 110 than the voltage applied to the second conductive layer 112, or a higher voltage may be applied to the second conductive layer 112 than the voltage applied to the first conductive layer 110.

Figure 5A:
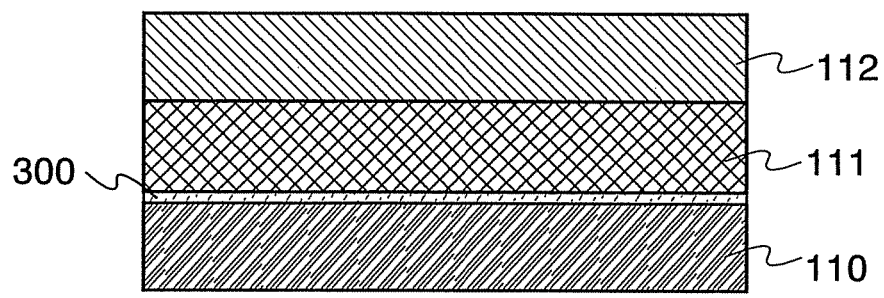
FIGS. 5A to 5C are views illustrating a structural example of a memory element of the present invention.
Figure 5B:
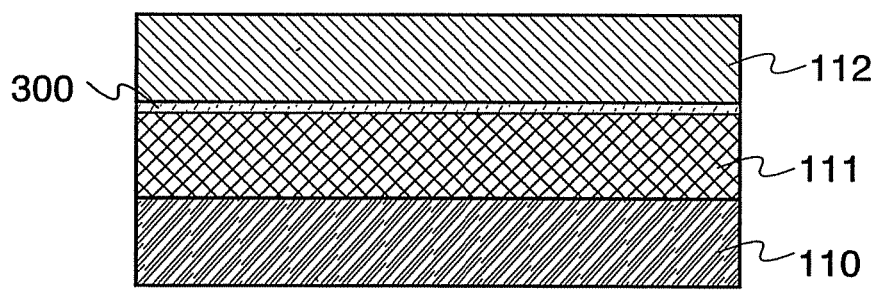
Figure 5C:
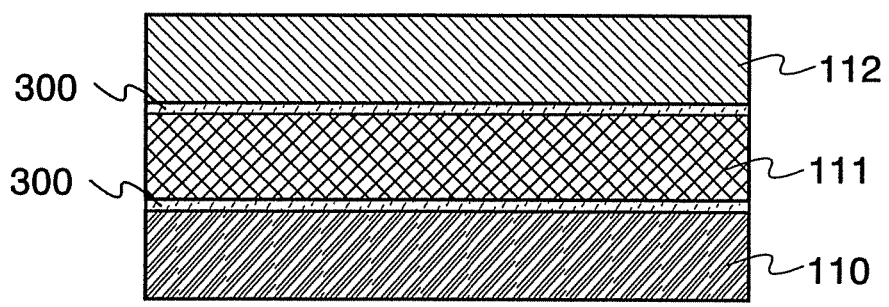

Further, the structure of the memory element is not limited to that shown in FIG. 1 but may be that shown in FIGS. 5A to 5C. A memory element shown in FIG. 5A has a first conductive layer 110, a layer 300, a memory layer 111, and a second conductive layer 112. The layer 300 and the memory layer 111 are provided between the first conductive layer 110 and the second conductive layer 112, and the memory layer 111 is formed on and in contact with the layer 300. Note that the film thickness of the layer 300 is not limited in particular; however, the thickness of the layer 300 is preferably greater than or equal to 0.1 nm and less than or equal to 50 nm.

The layer 300 is an insulating layer, and can be formed from an insulating inorganic or organic compound. For example, as an inorganic compound, an oxide such as lithium oxide ($Li_2O$), sodium oxide ($Na_2O$), potassium oxide ($K_2O$), rubidium oxide ($Rb_2O$), beryllium oxide (BeO), magnesium oxide (Mg), calcium oxide (CaO), strontium oxide (SrO), or barium oxide (BaO), a fluoride such as lithium fluoride (LiF), sodium fluoride (NaF), potassium fluoride (KF), rubidium fluoride (RbF), beryllium fluoride (BeF$_2$), magnesium fluoride (MgF$_2$), calcium fluoride (CaF$_2$), strontium fluoride (SrF$_2$), or barium fluoride (BaF$_2$), an insulating nitride, chloride, bromide, iodide, carbonate, sulfate or nitrate, or the like can be used. Further, as an insulating organic compound, polyimide, an acrylic polymer, polyamide, a benzocyclobutene-based resin, polyester, a novolac resin, a melamine resin, a phenol resin, an epoxy resin, silicone resin, a furan resin, a diallyl phthalate resin, or the like can be used. Further, a so-called siloxane-based material in which the main chain is formed from a bond of silicon and oxygen may be used.

When an insulating layer is provided as shown in FIG. 5A, leakage current which would flow to an element to which data have not been written when read voltage is applied can be reduced. Accordingly, power consumed at the time of reading can be reduced.

Note that write voltage with respect to a memory element of the present invention can be reduced by making the memory layer 111 thinner as described above. However, although the write voltage can be reduced when the memory layer 111 is thinned, if the thickness is too small, leakage current caused at the time of reading is increased. In such a case, it is especially effective to provide an insulating layer.

The insulating layer can be formed by a vapor deposition method, a sputtering method, a CVD method, a printing method, a spin coating method, a sol-gel process, a droplet discharge method, or the like. In particular, an insulating organic compound is preferably formed by a droplet discharge method. In this case, the insulating layer is formed by discharging a composition in which the organic compound or a reactant thereof is dissolved in an organic solvent onto a desired position and removing the solvent. Therefore, when a solvent which causes phase separation with the organic solvent used for forming the insulating layer is selected as a solvent of a composition for forming the memory layer 111, the composition for forming the memory layer 111 can be discharged even when the organic solvent is not completely removed when the insulating layer is formed. Accordingly, a drying step is not necessarily performed for removing the solvent forming the insulating layer; for example, it is sufficient that the substrate provided with the first conductive layer 110 be heated when the insulating layer is formed. Further, the drying step may also be used as a later step of drying performed to form the memory layer 111. In addition, since an insulating layer formed by a droplet discharge method using an insulating organic compound has low density and high volume, increase in the write voltage caused by the provision of the layer 300 can be minimized and leakage current at the time of reading, which flows to an element to which data have not been written can be reduced as compared to an insulating layer formed by another method or another insulating material.

Further, the layer 300 may be a semiconductor layer, and may be formed from an inorganic semiconductor such as molybdenum oxide, tin oxide, bismuth oxide, a silicon film, vanadium oxide, nickel oxide, zinc oxide, silicon germanium, gallium arsenide, gallium nitride, indium oxide, indium phosphide, indium nitride, cadmium sulfide, cadmium telluride, or strontium titanate can be used.

The semiconductor layer can also be formed by a droplet discharge method or a printing method. Further, as another formation method, a vapor deposition method, a method using an electron beam, a sputtering method, a CVD method, a spin coating method, a sol-gel process, or the like may be used.

Further, the structure of the memory element is not limited to that shown in FIG. 5A. The layer 300 may be provided in contact with the second conductive layer 112 as shown in FIG. 5B. Alternatively, as shown in FIG. 5C, the layer 300 may have two layers which are separately in contact with the first conductive layer 110 and the second conductive layer 112.

As described above, when an insulating layer or a semiconductor layer is provided, which is in contact with at least one of the first conductive layer and the second conductive layer, leakage current which flows to an element to which data have not been written at the time of reading can be reduced. Accordingly, power consumption can be reduced.

Embodiment Mode 2

This embodiment mode will describe a semiconductor device having a memory element of the present invention, typically a memory device, with reference to the drawings. Note that this embodiment mode will show a case where the structure of the memory device is a passive matrix type.

Figure 6A:
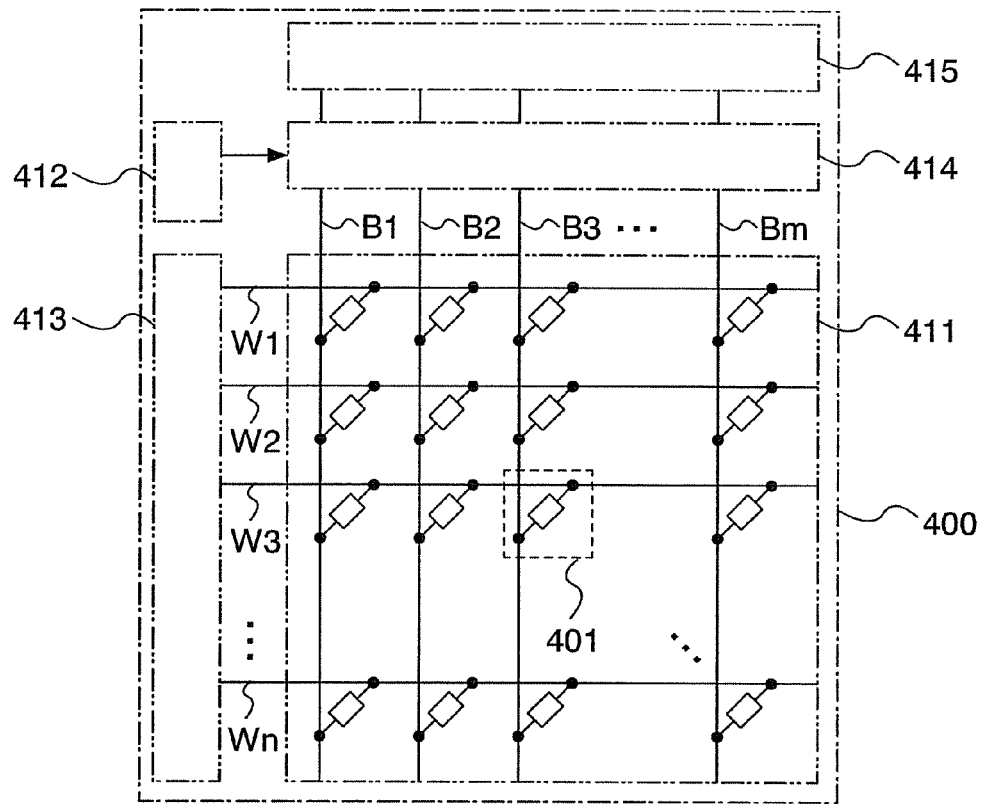
FIGS. 6A to 6C are diagrams illustrating a structural example of a memory element of the present invention.

FIG. 6A shows a structural example of a semiconductor device described in this embodiment mode. A semiconductor device 400 includes a memory cell array 411 where memory elements 401 are arranged in matrix, decoders 412 and 413, a selector 414, and a reading/writing circuit 415. The structure of the semiconductor device 400 which is shown here is only one example and the semiconductor device 400 may also include other circuits such as a sense amplifier, an output circuit, or a buffer.

The decoders 412 and 413, the selector 414, the reading/writing circuit 415, an interface, and the like may also be formed over a substrate as with the memory element. Alternatively, they may be attached externally as IC chips.

The memory elements 401 each include a first conductive layer connected to a word line Wy ($1 \leq y \leq n$), a second conductive layer connected to a bit line Bx ($1 \leq x \leq m$), and a memory layer provided between the first conductive layer and the second conductive layer.

Figure 7A:
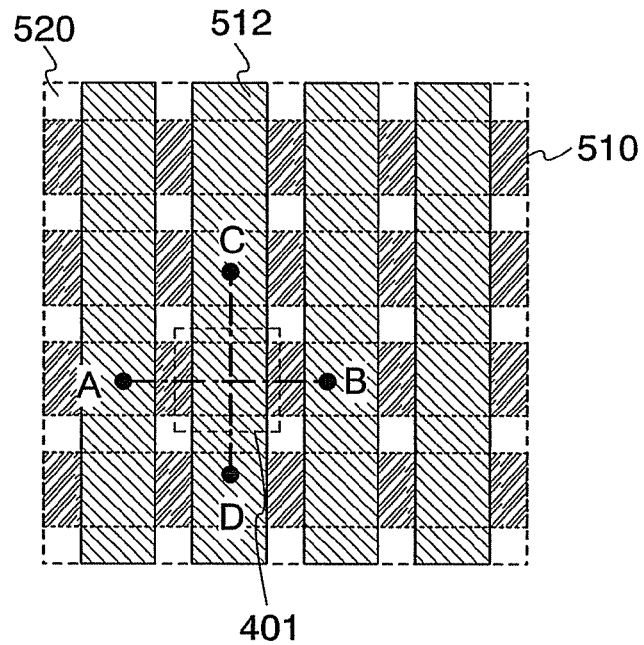
FIGS. 7A to 7C are views each illustrating a memory cell included in a semiconductor device of the present invention.
Figure 7B:
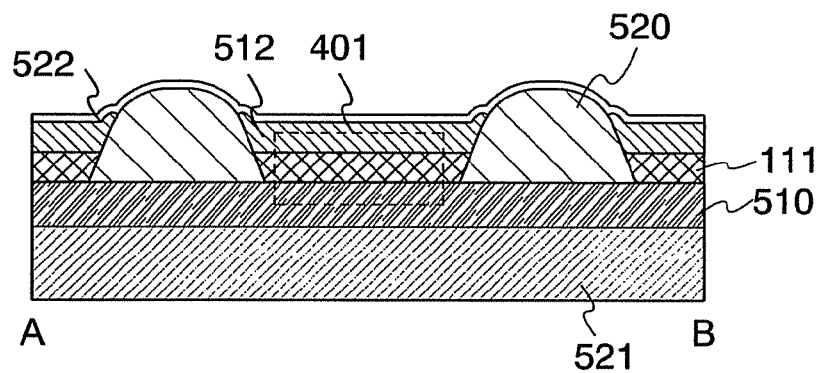
Figure 7C:
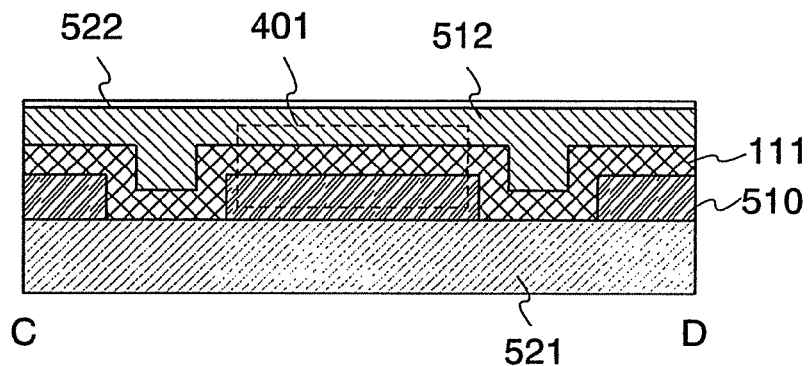

FIGS. 7A to 7C show examples of a top view and cross-sectional views of the memory cell array 411. Note that FIG. 7A shows the top view of part of the memory cell array 411.

In the memory cell array 411, the memory elements 401 are arranged in matrix. The memory elements 401 each have, over a substrate, a first conductive layer 510 extended in a first direction (A-B), and a memory layer and a second conductive layer 512 which are extended in a second direction (C-D) perpendicular to the first direction. Note that a partition wall (insulating layer) 520 extended in the second direction is provided between each of a plurality of stacks of the memory layer and the second conductive layer 512. The partition walls (insulating layers) 520 separate the memory elements neighboring to each other in the first direction (A-B). Note that each layer used for the memory elements 401 can be formed of a substance described in Embodiment Mode 1. In FIG. 7A, an insulating layer serving as a protective film which is provided to cover the partition walls (insulating layers) 520 and the second conductive layers 512 is omitted.

Note that the first conductive layers 510 in this embodiment mode correspond to the first conductive layer 110, and the memory layers corresponds to the memory layer 111 in Embodiment Mode 1. In addition, the second conductive layers 512 correspond to the second conductive layer 112 in Embodiment Mode 1. Portions similar to those in Embodiment Mode 1 are denoted by reference numerals in common, and detailed explanations of similar portions or portions having similar functions will not be repeated.

An example of a cross-sectional structure taken along line A-B in FIG. 7A is shown in FIG. 7B, and an example of a cross-sectional structure taken along line C-D in FIG. 7A is shown in FIG. 7C. As for a substrate 521 over which the memory elements 401 are provided, a quartz substrate, a silicon substrate, a metal substrate, a stainless steel substrate, paper made of a fiber material, or the like can be used as well as a glass substrate or a flexible substrate. The flexible substrate refers to a substrate that can be bent (flexible), and a plastic substrate or the like made of polycarbonate, polyarylate, polyethersulfone, or the like can be given, for example. In addition, a film (a film made of polypropylene, polyester, polyvinyl fluoride, polyvinyl chloride, or the like) can also be used.

Further, a thin film transistor (TFT) may also be provided over a substrate having an insulating property and the memory elements 401 may also be provided thereover. Alternatively, instead of the above substrate, a semiconductor substrate such as a Si substrate or an SOI substrate may also be used to form a field-effect transistor (FET) over the substrate, and the memory elements 401 may also be provided thereover. In addition, the memory elements 401 may be attached to the thin film transistor or the field-effect transistor. In this case, the memory element 401 and the thin film transistor or the field-effect transistor are manufactured through different processes from each other, and then the thin film transistor or the field-effect transistor can be provided by being attached to the memory element with the use of a conductive film, an anisotropic conductive adhesive, or the like.

In FIGS. 7B and 7C, first, the first conductive layers 110 are formed over the substrate 521, using a vapor deposition method, a sputtering method, a CVD method, a printing method, an electrolytic plating method, an electroless plating method, a droplet discharge method, or the like. Next, the partition walls (insulating layers) 520 are formed by a sputtering method, a CVD method, a printing method, a droplet discharge method, a spin coating method, a vapor deposition method, or the like. Note that partition walls (insulating layers) 520 may be formed from an inorganic insulating material such as silicon oxide, silicon nitride, or silicon oxynitride; acrylic acid, methacrylic acid, or a derivative thereof; a thermostable high molecule such as polyimide, aromatic polyamide, or polybenzimidazole; or a siloxane resin. Further, a resin material such as a vinyl resin like polyvinyl alcohol or polyvinyl butyral, an epoxy resin, a phenol resin, a novolac resin, an acrylic resin, a melamine resin, or a urethane resin may be used; alternatively, an organic material such as benzocyclobutene, parylene, fluorinated arylene ether, or polyimide; a composition containing a water-soluble homopolymer and a water-soluble copolymer; or the like may be used. In the cross section taken along line A-B, that is, the cross sections of the partition walls (insulating layers) 520 shown in FIG. 7B, it is preferable that the side surfaces of the partition walls (insulating layers) 520 be inclined by an angle greater than or equal to 10° and less than 60°, preferably, greater than or equal to 25° and less than or equal to 45° with respect to the surfaces of the first conductive layers 110. Alternatively, it is preferable that the partition walls (insulating layers) 520 be curved. With such a shape, when the memory layer 111 is formed by a droplet discharge method, a discharge material can be prevented from unnecessarily spreading from a desired portion. Next, as described above, the memory layers 111 are formed over the first conductive layers 110 by a droplet discharge method. In addition, the second conductive layers 112 are formed over the memory layers 111 by a vapor deposition method, a sputtering method, a CVD method, a printing method, a droplet discharge method, or the like. Further, an insulating layer 522 is provided as a protective film so as to cover the partition walls (insulating layers) 520 and the second conductive layers 112. Note that silicon oxide, silicon nitride, silicon oxynitride, or the like can be used for the protective film, whereby penetration of moisture, oxygen, or the like can be prevented.

Further, in the cross section taken along line C-D, that is, the cross section of the first conductive layer 110 shown in FIG. 7C, it is preferable that the side surfaces of the first conductive layer 110 be almost perpendicular or be inclined by an angle greater than or equal to 10° and less than 90° with respect to the surface of the substrate 521. Further, the first conductive layer 110 may have a curved shape in which the curvature radius changes continuously. Note that "almost perpendicular" means 90° (±1°) here. With such a shape, the coverage of the first conductive layer 110 by the memory layer 111, the second conductive layer 112, and the like which are stacked thereover can be improved.

Note that since the discharge material for forming the memory layer 111 is fluid, so that it is greatly affected by the surface condition of a region on which the memory layer 111 is formed. Accordingly, the partition walls (insulating layers) 520 may be subjected to a treatment for controlling wettability. The wettability of the solid surface is affected by the chemical property and the physical surface shape (surface roughness) of the surface. A treatment for controlling wettability of a surface in the present invention means forming regions having different wettabilities with respect to a fluid discharge material on a region where the fluid discharge material is applied. Note that the regions having different wettabilities are regions having different wettabilities with respect to a discharge material, that is, regions having different contact angles with respect to a discharge material. A region having a larger contact angle with respect to a discharge material is a region having lower wettability (hereinafter also referred to as a low wettability region), and a region having a smaller contact angle is a region having higher wettability (hereinafter also referred to as a high wettability region). When a contact angle is large, a fluid discharge material does not spread on a surface where the discharge material is applied, while the discharge material spreads when the contact angle is small. Thus, regions having different wettabilities have different surface energies, and the surface energy of a region having low wettability is low, while the surface energy of a region having high wettability is high.

Note that the difference of wettabilities is relative to each region. Here, a low wettability region is formed on the partition walls (insulating layers) 520 on which the memory layer 111 is formed; thus, a region having a wettability different from a region where the memory layer is desired to be formed can be formed. As a method for selectively forming the low-wettability region, a method in which a layer containing a low-wettability substance is selectively formed by forming and using a mask layer, a method in which surface treatment is performed selectively with the use of a mask layer, or the like can be used.

For example, as a method for changing and controlling surface wettability, there is a method in which wettability is changed by decomposing a surface substance and modifying a region surface with the use of light irradiation energy. As the low-wettability substance, a substance containing a fluorocarbon group (or fluorocarbon chain) or a substance containing a silane coupling agent can be used. The silane coupling agent can form a monomolecular film; therefore, modification can be efficiently carried out and wettability can be changed in a short time. In addition, not only a silane coupling agent having a fluorocarbon group chain but also that having an alkyl group can be used, because the silane coupling agent having an alkyl group exhibits low wettability when arranged over a substrate. Further, as the low-wettability substance, a titanate coupling agent and an aluminate coupling agent may also be used.

A fluid discharge material moves to a side where wettability is high; thus, a pattern can be formed in a more accurate position. Further, efficiency in the use of the material can be improved.

Figure 8A:
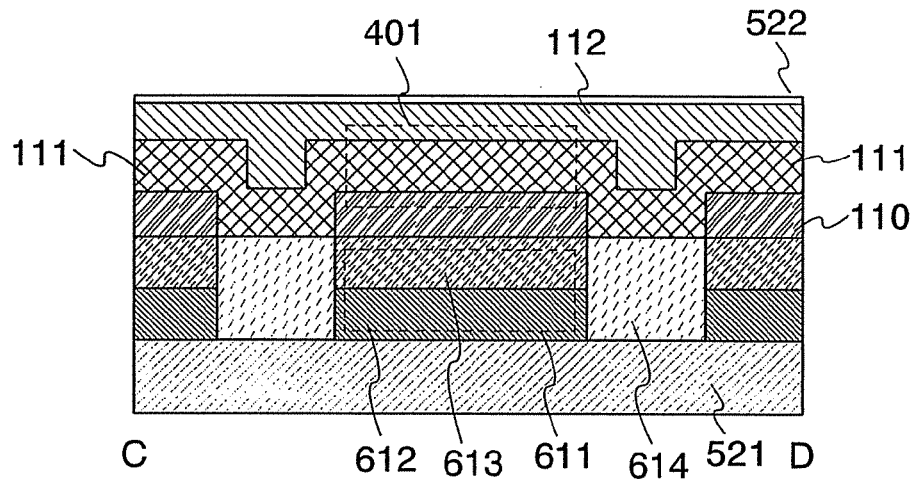
FIGS. 8A to 8C are views each illustrating a structural example of a memory element of the present invention.

Further, as shown in the cross-sectional structure taken along line C-D in FIG. 8A, an element having a rectifying property may be provided between a first conductive layer 110 and a substrate 521 in a memory element 401. The element having a rectifying property is a Schottky-barrier diode, a PIN junction diode, a PN junction diode, or a diode-connected transistor, and the like. Here, a diode 611 including a third conductive layer 612 and a semiconductor layer 613 is provided under and in contact with the first conductive layer 110. Note that the diode 611 corresponding to each memory element is separated by an interlayer insulating film 614. In addition, the element having a rectifying property may be provided on the opposite side of a memory layer 111 so as to be in contact with the memory layer 111 and be provided with a second conductive layer 112 interposed therebetween.

Figure 8B:
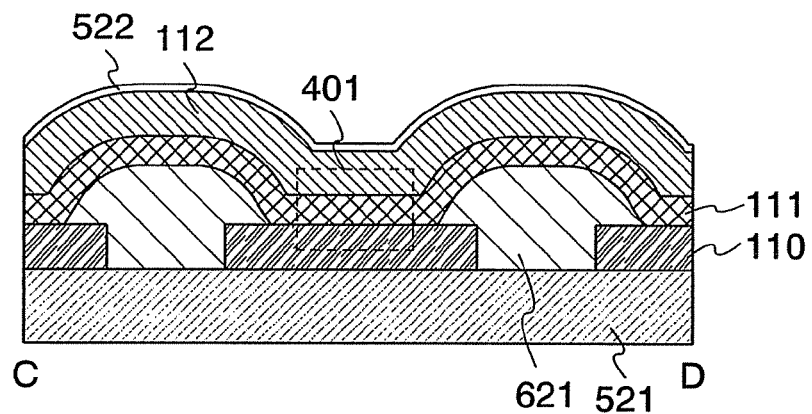

Further, when there is a concern that an adverse effect of an electric field is caused between the memory elements neighboring to each other in the second direction (C-D), a partition wall (insulating layer) 621 may be provided between first conductive layers 110 of the memory elements as shown in FIG. 8B. Thus, an adverse effect of an electric field caused between the neighboring memory elements is prevented, and in addition to that, breakage of the memory layer 111 which is caused by steps of the first conductive layer 110 when the memory layer 111 is provided so as to cover the first conductive layer 110 can be prevented.

Figure 8C:
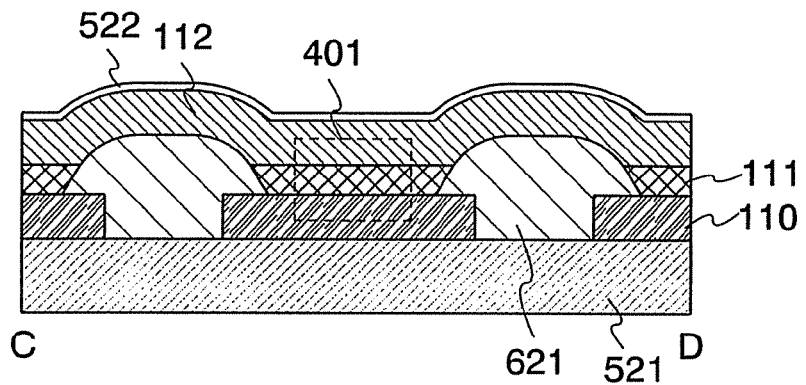

Note that the cross sections of the partition walls (insulating layer) 621 shown in FIG. 8B, it is preferable that the side surfaces of the partition walls (insulating layers) 621 be each inclined by an angle greater than or equal to 10° and less than 60°, preferably, greater than or equal to 25° and less than or equal to 45° with respect to the surfaces of the first conductive layers 110. Further, it is preferable that the partition walls (insulating layers) 621 be curved. The partition walls (insulating layer) 621 are provided as described above; then, the memory layers 111 and the second conductive layers 112 are formed so as to cover the first conductive layers 110 and the partition walls (insulating layer) 621. Without limitation to the above structure, the memory layer 111 may be formed only over the first conductive layer 110 as shown in FIG. 8C. In this case, it is preferable to perform a treatment for controlling wettability on the partition walls (insulating layer) 621 to form a low wettability region.

Next, an operation in writing data to a memory element will be described. Here, a case of writing data by an electric action, typically by voltage applied thereto, will be described with reference to FIGS. 6A to 6C. Note that the data is written with the use of change of the electrical characteristics of the memory element, and "0" and "1" refer to data in an initial state (a state where an electric action is not applied) of the memory element and data in a state where the electrical characteristics are changed, respectively.

When data "1" is written to the memory element 401, first, the memory element 401 is selected by the decoders 412 and 413, and the selector 414. Specifically, predetermined potential V2 is applied to the word line W3 connected to the memory element 401 by the decoder 413. In addition, the bit line B3 connected to the memory element 401 is connected to the reading/writing circuit 415 by the decoder 412 and the selector 414. Then, writing potential V1 is output to the bit line B3 from the reading/writing circuit 415. Thus, a voltage Vw (Vw=V1−V2) is applied between the first conductive layer and the second conductive layer included in the memory element 401. By proper selection of the voltage Vw, the memory layer which is provided between the conductive layers is changed physically or electrically so that the data "1" is written. Specifically, as for a reading operation voltage, electric resistance between the first and second conductive layers when the memory element 401 is in the state of the data "1" may be largely lowered than electric resistance therebetween when the memory element 401 is in the state of data "0". For example, the first and second conductive layers may be short-circuited (shorted). The voltage Vw may be set to be greater than or equal to 5 V and less than or equal to 15 V or greater than or equal to −15 V and less than or equal to −5 V.

Further, non-selected word lines and non-selected bit lines are controlled so that the data "1" is not written to the memory elements connected to the non-selected word lines and the non-selected bit lines. For example, the non-selected word lines and the non-selected bit lines may be made in a floating state. In addition, potential set to be the same degree as that of the second conductive layer may be applied to the non-selected bit lines.

On the other hand, when data "0" is written to the memory element 401, an electric action may not be applied to the memory element 401. As for a circuit operation, for example, the memory element 401 is selected by the decoders 412 and 413, and the selector 414 as well as the case of writing data "1"; however, the output potential from the reading/writing circuit 415 to the bit line B3 is set to be the same degree as potential of the selected word line W3 or potential of the non-selected lines, and a voltage (for example, greater than or equal to −5 V and less than or equal to 5 V), at which electrical characteristics of the memory element 401 is not changed, may be applied between the first and second conductive layers included in the memory element 401.

Figure 6B:
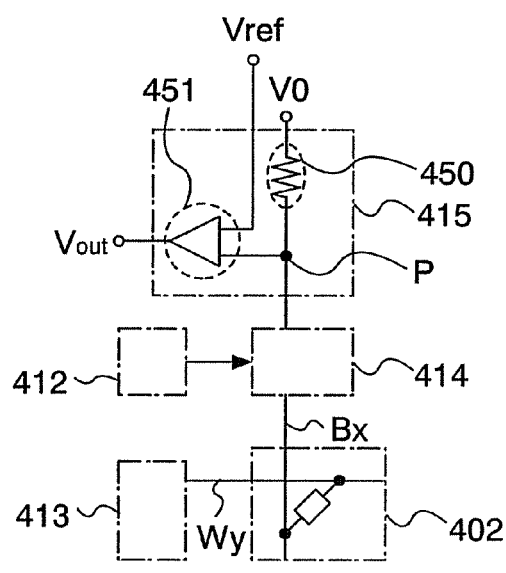
Figure 6C:
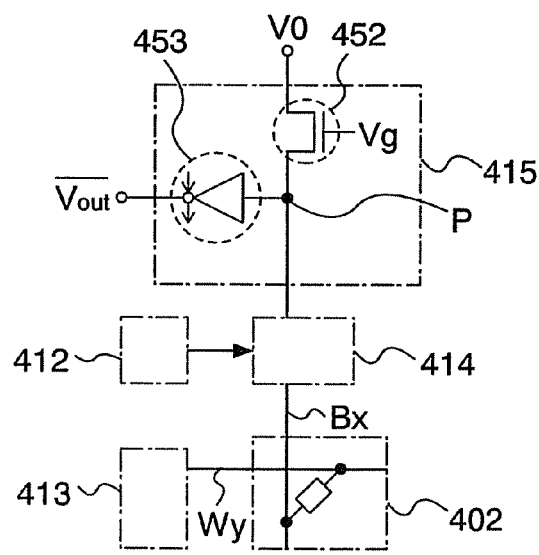

Next, an operation when data is read from a memory element will be described with reference to FIG. 6B. Data is read by utilization of a difference in electrical characteristics between the first and second conductive layers in a memory element having the data "0" and a memory element having the data "1". For example, a method for reading data by utilization of a difference in electric resistance when effective electric resistance between the first and second conductive layers included in the memory element having the data "0" (hereinafter, simply referred to as electric resistance of the memory element) is R0 at a reading voltage and electric resistance of the memory element having data "1" is R1 at a reading voltage, will be described. Note that R1<<R0. As a structure of a reading portion of the reading/writing circuit 415, for example, a circuit including a resistance element 450 and a differential amplifier 451 as shown in FIG. 6B can be used. The resistance element 450 has a resistance value Rr, where R1<Rr<R0. A transistor 452 may be used as a substitute for the resistance element 450 or a clocked inverter 453 can be used as a substitute for the differential amplifier 451, as shown in FIG. 6C. A signal φ or an inversion signal thereof, which becomes High when data is read and Low when no data is read, is input to the clocked inverter 453. Of course, the circuit configurations are not limited to FIGS. 6B and 6C.

When data is read from a memory element 402, first, the memory element 402 is selected by the decoders 412 and 413, and the selector 414. Specifically, predetermined potential Vy is applied to a word line Wy connected to the memory element 402 by the decoder 413. In addition, a bit line Bx connected to the memory element 402 is connected to a terminal P of the reading/writing circuit 415 by the decoder 412 and the selector 414. As a result, potential Vp of the terminal P becomes a value determined by resistor division of Vy and V0 with the use of the resistance element 450 (a resistance value: Rr) and the memory element 402 (a resistance value: R0 or R1). Therefore, in the case where the memory element 402 has the data "0", potential Vp0 of the terminal P is Vp0=Vy+(V0−Vy)×R0/(R0+Rr). Moreover, when the memory element 402 has the data "1", potential Vp1 of the terminal P is Vp1=Vy+(V0−Vy)×R1/(R1+Rr). As a result, Low/High (or High/Low) is output as output potential Vout in accordance with the data "0" and data "1", and can be read by selection of Vref to be between Vp0 and Vp1 in FIG. 6B and selection of a variation point of the clocked inverter 453 to be between Vp0 and Vp1 in FIG. 6C.

For example, the differential amplifier 451 is operated when Vdd is 3 V, and Vy is set to be 0 V; V0, 3 V; and Vref, 1.5 V. If R0/Rr=Rr/R1=9, when the memory element has the data "0", Vp0 becomes 2.7 V and High is output as Vout. When the memory element has the data "1", Vp1 becomes 0.3 V and Low is output as Vout. Thus, data can be read from the memory element.

According to the above method, a state of electric resistance of the memory layer is read by the amount of a voltage by utilization of a difference in resistance value and resistor division. Of course, the reading method is not limited thereto. For example, the state of electric resistance of the memory layer may be read by utilization of a difference in the amount of current instead of utilization of a different in electric resistance. In the case where electrical characteristics of the memory element have different diode characteristics in threshold voltage in the case of data "0" and data "1", reading may be carried out by using difference in threshold voltage.

In addition, a thin film transistor (TFT) may be provided over a substrate having an insulating property, and the memory element or a memory element array may be provided thereover. Alternatively, instead of the substrate having an insulating property, a semiconductor substrate such as a Si substrate or an SOI substrate may be used to form a field-effect transistor (FET) over the substrate, and the memory element or a memory element array may be provided thereover.

Regarding the semiconductor device described in this embodiment mode, data can be written to the semiconductor device not only once but can also be written additionally. Since data once written to a memory element cannot be erased, it is possible to prevent forgery by rewriting. Further, since the semiconductor device includes a memory element of the present invention, which can be manufactured simply with high yield, a semiconductor device with excellent performance and reliability can be manufactured inexpensively.

Note that this embodiment mode can be combined with any of the other embodiment modes and embodiments as appropriate. Therefore, in a memory element included in the semiconductor device described in this embodiment mode, for example, an insulating layer or a semiconductor layer may be provided between a memory layer and at least one of a first conductive layer and a second conductive layer.

Embodiment Mode 3

Figure 9A:
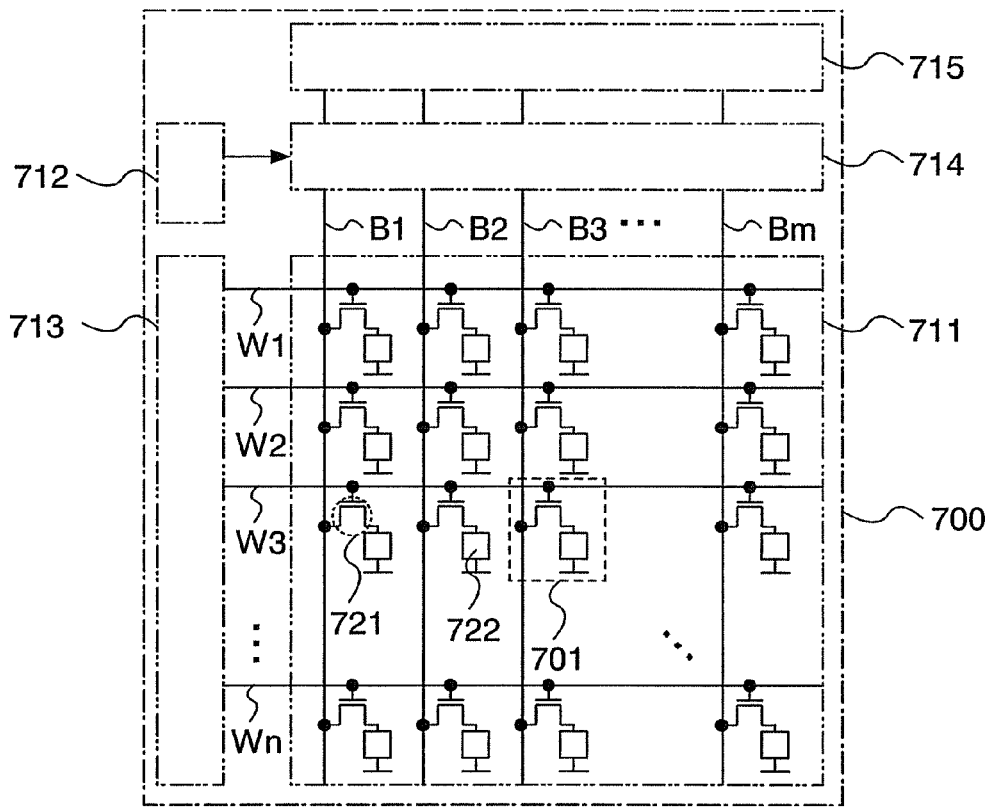
FIGS. 9A to 9C are diagrams illustrating a structural example of a semiconductor device of the present invention.
Figure 9B:
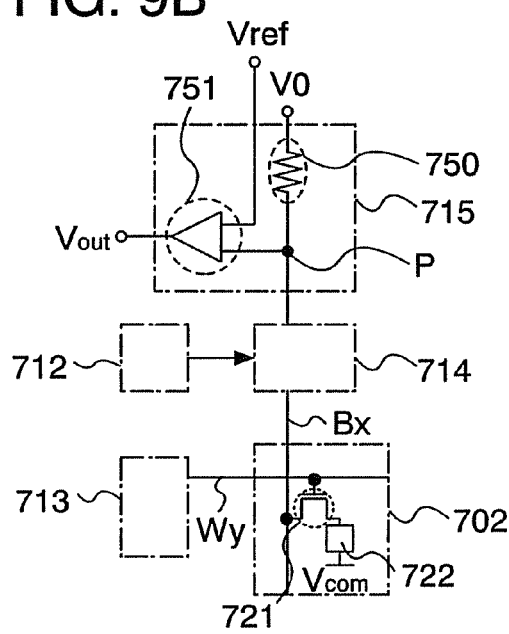
Figure 9C:
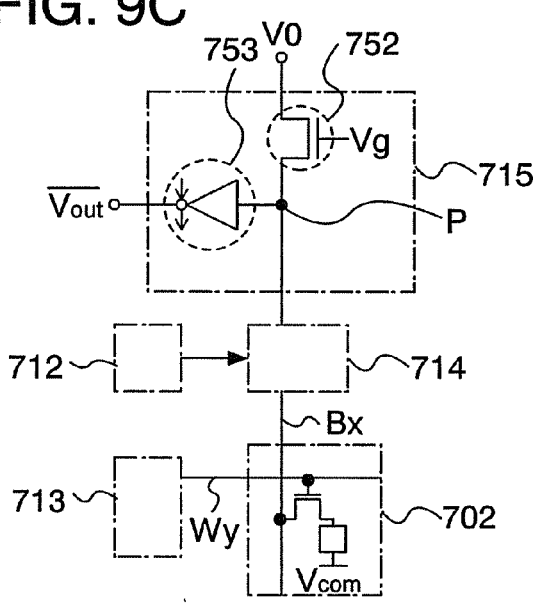

This embodiment mode will describe a semiconductor device having a memory element of the present invention with reference to FIGS. 9A to 9C. Specifically, this embodiment mode will describe an active-matrix memory device.

FIG. 9A shows a structural example of a semiconductor device described in this embodiment mode. A semiconductor device 700 includes a memory cell array 711 where memory cells 701 are arranged in matrix, decoders 712 and 713, a selector 714, and a reading/writing circuit 715. The structure of the semiconductor device 700 which is shown here is only one example and the semiconductor device 700 may also include other circuits such as a sense amplifier, an output circuit, or a buffer.

The decoders 712 and 713, the selector 714, the reading/writing circuit 715, an interface, and the like may also be formed over a substrate as with a memory element. Alternatively, they may be attached externally as IC chips.

The memory cell 701 includes a first wiring connected to a bit line Bx (1≤x≤m), a second wiring connected to a word line Wy (1≤y≤n), a thin film transistor 721, and a memory element 722. The memory element 722 has a structure where a memory layer is interposed between a pair of conductive layers.

Next, examples of a top view and cross-sectional views of the memory cell array 711 having the above structure will be described with reference to FIGS. 10A to 10C. Note that FIG. 10A shows the top view of part of the memory cell array 711.

In the memory cell array 711, a plurality of memory cells 701 is arranged in matrix. In the memory cell 701, a thin film transistor 721 serving as a switching element and a memory element connected to the thin film transistor 721 are provided over a substrate having an insulating property.

Figure 10A:
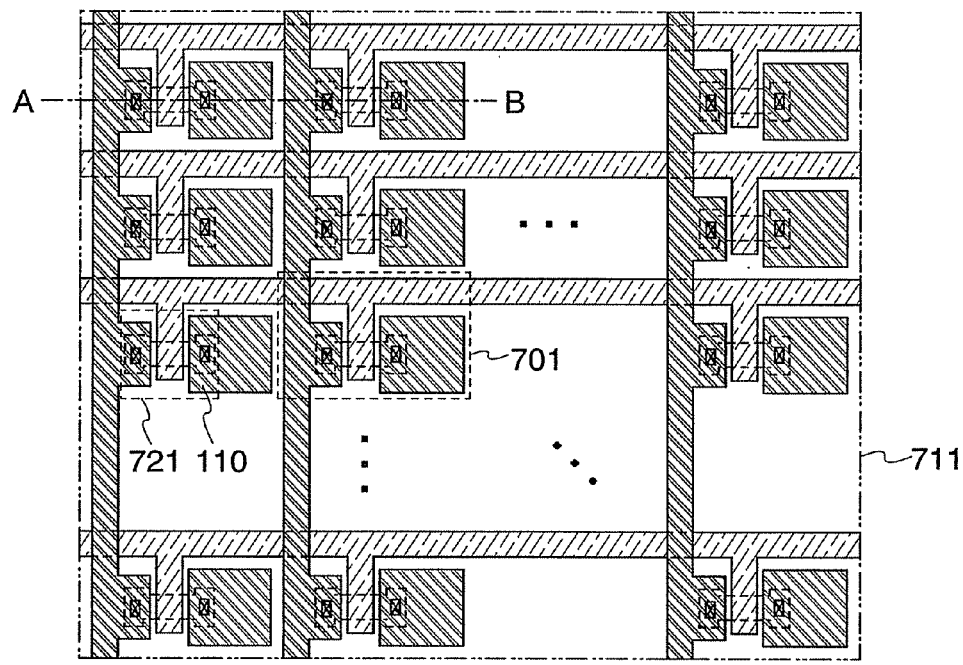
FIGS. 10A to 10C are views each illustrating a memory cell included in a semiconductor device of the present invention.
Figure 10B:
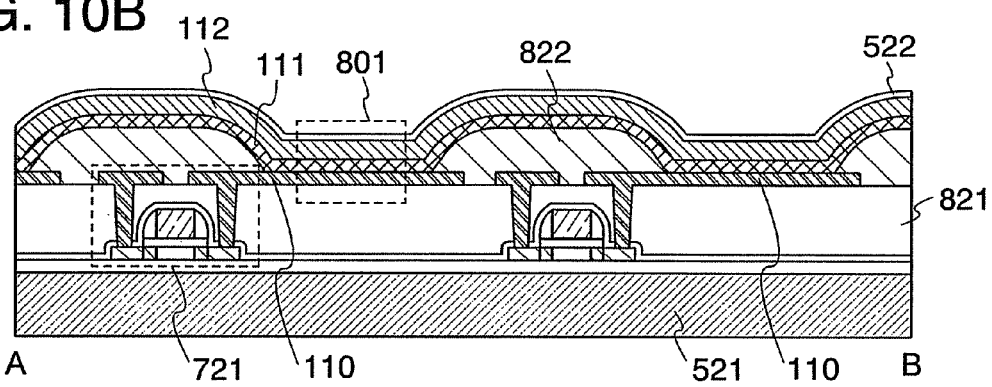

FIG. 10B shows an example of a cross-sectional structure taken along line A-B in FIG. 10A. Note that, in FIG. 10A, partition walls (insulating layers) 822, a memory layer 111, a second conductive layer 112, and an insulating layer 522 which are provided over first conductive layers 110 are omitted.

The memory cell 701 includes the thin film transistor 721, a memory element 801, an insulating layer 821, and the partition wall (insulating layer) 822 covering part of the first conductive layers 110. Note that the insulating layer 522 serving as a protective film is provided to cover the memory element 801. The memory element 801 is connected to the thin film transistor 721 which is formed over a substrate 521 having an insulating surface, and includes the first conductive layer 110, the memory layer 111, and the second conductive layer 112 which are formed over the insulating layer 821. The memory layer 111 is formed from nanoparticles of a conductive material, each of which is coated with an organic thin film as described above. Moreover, the thin film transistor 721 is not particularly limited as long as it serves as a switch, and it is not particularly necessary to be a thin film transistor.

Figure 11A:
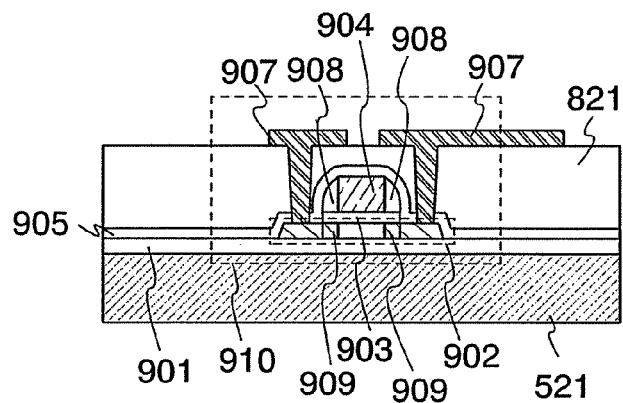
FIGS. 11A to 11D are views each illustrating one mode of a thin film transistor.

One mode of the thin film transistor 721 will be described with reference to FIGS. 11A to 11D. FIG. 11A shows an example of applying a top-gate thin film transistor. An insulating layer 901 is provided over a substrate 521 as a base film, and a thin film transistor 910 is provided over the insulating layer 901. In the thin film transistor 910, a semiconductor layer 902 and an insulating layer 903 serving as a gate insulating layer are provided over the insulating layer 901, and a gate electrode 904 is formed over the semiconductor layer 902 with the insulating layer 903 interposed therebetween. Note that an insulating layer 905 serving as a protective layer and an insulating layer 821 serving as an interlayer insulating layer are formed over the thin film transistor 910. Moreover, wirings 907 connected to a source region and a drain region of the semiconductor layer are formed.

An insulating film such as a silicon oxide film, a silicon nitride film, or a silicon oxynitride film is used to form the insulating layer 901, which is formed in a single layer or a multilayer of two or more layers of these insulating films. Note that the insulating layer 901 may be formed by a sputtering method, a CVD method, or the like.

As for the semiconductor layer 902, a crystalline semiconductor film such as polysilicon may also be used, as well as an amorphous semiconductor such as amorphous silicon, a semiamorphous semiconductor, or a microcrystalline semiconductor.

In particular, a crystalline semiconductor formed by crystallization of an amorphous or microcrystalline semiconductor by laser light irradiation, a crystalline semiconductor formed by crystallization of an amorphous or microcrystalline semiconductor by heat treatment, or a crystalline semiconductor formed by crystallization of an amorphous or microcrystalline semiconductor by combination of heat treatment and laser irradiation is preferably used. In the heat treatment, a crystallization method using a metal element such as nickel, which has a function of promoting crystallization of a silicon semiconductor, can be employed.

In the case of the crystallization with laser light irradiation, it is possible to perform crystallization in such a way that a portion in a crystalline semiconductor that is melted by irradiation with laser light is continuously moved in a direction where the laser light is delivered, where the laser light is continuous wave laser light or ultrashort pulsed laser light having a high repetition rate of greater than or equal to 10 MHz and a pulse width of less than or equal to 1 nanosecond, preferably 1 picosecond to 100 picoseconds. With the use of such a crystallization method, a crystalline semiconductor having a large grain diameter with a crystal grain boundary extending in one direction can be obtained. By a drift direction of carriers being made to conform to the direction where the crystal grain boundary extends, the electric field effect mobility in the transistor can be increased. For example, electric field effect mobility greater than or equal to 400 $cm^2/V \cdot sec$ can be achieved.

A large glass substrate can be used when the above crystallization step is applied to a crystallization process where the temperature is less than or equal to the heat resistant temperature of a glass substrate (approximately 600° C.). Therefore, a large number of semiconductor devices can be manufactured with one substrate, and cost can be decreased.

In addition, with the use of a substrate that can withstand heat temperature, the semiconductor layer 902 may be formed by a crystallization step which is performed through heating at the temperature higher than a heat resistant temperature of a glass substrate. Typically, a quartz substrate is used as the insulating substrate and an amorphous or microcrystalline semiconductor is heated at temperatures greater than or equal to 700° C. to form the semiconductor layer 902. As a result, a semiconductor with superior crystallinity can be formed. In this case, a thin film transistor which is superior in response speed, mobility, and the like and which is capable of a high-speed operation can be provided.

The gate electrode 904 can be formed using metal or a polycrystalline semiconductor added with an impurity having one conductivity type. When the gate electrode 904 is formed using metal, tungsten (W), molybdenum (Mo), titanium (Ti), tantalum (Ta), aluminum (Al), or the like can be used. In addition, metal nitride formed by nitriding of metal can be used. Alternatively, the gate electrode 904 may include a first layer formed from the metal nitride and a second layer formed from metal to be stacked. When the gate electrode 904 has a stacked-layer structure, a so-called hat shape, where an edge portion of the first layer may protrude from an edge portion of the second layer, may be employed. In this case, when the first layer is formed using metal nitride, the first layer can serve as barrier metal. In other words, the first layer can prevent metal contained in the second layer from dispersing in the insulating layer 903 and the underlying semiconductor layer 902.

Note that sidewalls (sidewall spacers) 908 may be provided on the both side faces of the gate electrode 904. An insulating layer is formed by a CVD method and anisotropic etching is performed on the insulating layer by an RIE (Reactive Ion Etching) method so that the sidewalls can be formed.

The transistor formed of the semiconductor layer 902, the insulating layer 903, the gate electrode 904, and the like by being combined can employ various kinds of structures such as a single drain structure, an LDD (lightly doped drain) structure, and a gate overlapped drain structure. FIG. 11A shows a thin film transistor having an LDD structure in which low concentration impurity regions 909 are formed in the semiconductor layer overlapped with the sidewalls. In addition, a single gate structure, a multi-gate structure, in which transistors, to which gate voltage having the same potential in terms of equivalence, are connected in series, a dual-gate structure in which a semiconductor layer is interposed between gate electrodes, or the like can also be applied.

The insulating layer 821 is formed from an inorganic insulating material such as silicon oxide and silicon oxynitride or an organic insulating material such as an acrylic resin and a polyimide resin. When a coating method such as spin coating and roll coater is used, after coating of a material for an insulating film which is dissolved in an organic solvent, the material is subjected to heat treatment so that an insulating layer formed from silicon oxide can be used. For example, a coating film containing siloxane bonds is formed in advance so that an insulating layer which can be formed through heat treatment at 200° C. to 400° C. can be used. When an insulating layer formed by a coating method or an insulating layer which is planarized by reflow is used for the insulating layer 821, disconnection of a wiring provided over the insulating layer can be prevented. Further, the insulating layer formed by such a method can be effectively used for forming a multilayer wiring.

The wirings 907 formed over the insulating layer 821 can be provided to intersect with a wiring formed in the same layer as the gate electrode 904. A multilayer wiring structure is formed. A plurality of insulating layers having a function similar to that of the insulating layer 821 is stacked and a wiring is formed thereover so that a multilayer wiring structure can be formed. The wiring 907 is preferably formed in combination of a low resistance material such as aluminum (Al) and a barrier metal using a high melting point metal material such as titanium (Ti) or molybdenum (Mo), for example, in a stacked-layer structure of titanium (Ti) and aluminum (Al), a stacked-layer structure of molybdenum (Mo) and aluminum (Al), or the like.

Figure 11B:
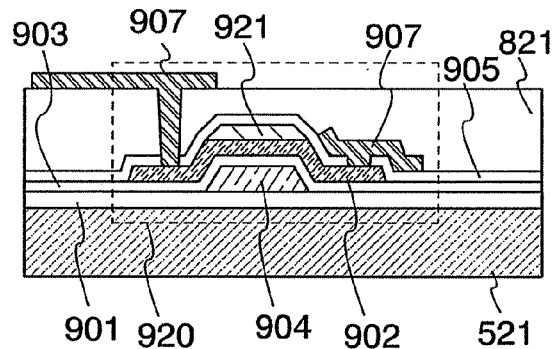

FIG. 11B shows an example of applying a bottom-gate thin film transistor. An insulating layer 901 is formed over an insulating substrate 521, and a thin film transistor 920 is provided thereovel In the thin film transistor 920, a gate electrode 904, an insulating layer 903 serving as a gate insulating layer, and a semiconductor layer 902 are provided, and a channel protective layer 921, an insulating layer 905 serving as a protective layer, and an insulating layer 821 serving as an interlayer insulating layer are provided thereovel Further, an insulating layer serving as a protective layer may also be provided thereover. Wirings 907 each connected to a source region and a drain region of the semiconductor layer can be formed over the insulating layer 905 or the insulating layer 821. Note that the insulating layer 901 may not be provided in the case of the bottom-gate thin film transistor.

When the substrate 521 is a flexible substrate, the substrate 521 has a lower heat resistant temperature as compared to a non-flexible substrate such as a glass substrate. Therefore, the semiconductor layer of the thin film transistor is preferably formed using an organic semiconductor.

Figure 11C:
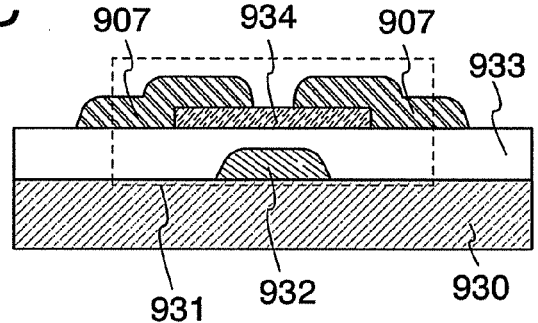

Here, a structure of a thin film transistor formed using an organic semiconductor for a semiconductor layer will be described with reference to FIGS. 11C and 11D. FIG. 11C shows an example where a staggered organic semiconductor transistor is applied. An organic semiconductor transistor 931 is provided over a flexible substrate 930. The organic semiconductor transistor 931 includes a gate electrode 932, an insulating layer 933 serving as a gate insulating film, a semiconductor layer 934 which is provided in a place where the gate electrode 932 and the insulating layer 933 are overlapped, and wirings 907 being connected to the semiconductor layer 934. Note that the semiconductor layer is in contact with the insulating layer 933 serving as a gate insulating film and the wirings 907.

The gate electrode 932 can be formed using a material and a method similar to those of the gate electrode 904. In addition, the gate electrode 932 can also be formed by being dried and baked with the use of a droplet discharge method. Moreover, a paste containing fine particles is printed over the flexible substrate by a printing method and the paste is dried and baked so that the gate electrode 932 can be formed. As a typical example of the fine particles, fine particles mainly containing any one of gold, copper, an alloy of gold and silver, an alloy of gold and copper, an alloy of silver and copper, and an alloy of gold, silver, and copper may also be used. Further, fine particles mainly containing conductive oxide such as indium tin oxide (ITO) as their main component may also be used.

The insulating layer 933 serving as a gate insulating film can be formed using a material and a method similar to those of the insulating layer 903. However, when the insulating layer is formed by heat treatment after coating of a material for an insulating film which is dissolved in an organic solvent, the heat treatment is performed at a temperature lower than a heat resistant temperature of the flexible substrate.

As a material for the semiconductor layer 934 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetracyanoquinodimethane), PTCDA (a perylene carboxylic acid anhydrous compound), NTCDA (a naphthalenecarboxylic acid anhydrous compound), or the like can be used. Moreover, as a material for the semiconductor layer 934 of the organic semiconductor transistor, a pi-conjugated system high molecular compound such as an organic high molecular compound, carbon nanotube, polyvinyl pyridine, a phthalocyanine metal complex, and the like can be given. In particular, a pi-conjugated system high molecular composed of a conjugated double bond as a skeleton such as polyacetylene, polyaniline, polypyrrole, polythienylene, a polythiophene derivative, poly(3alkylthiophene), a polyparaphenylene derivative, or a polyparaphenylenevinylene derivative, is preferably used.

As a method for forming the semiconductor layer of the organic semiconductor transistor, a vapor deposition method, a coating method, a spin coating method, a bar coating method, a solution casting method, a dip coating method, a screen printing method, a roll coating method, or a droplet discharge method can be used. The thickness of the semiconductor layer is preferably greater than or equal to 1 nm and less than or equal to 1000 nm, more preferably, grater than or equal to 10 nm and less than or equal to 100 nm.

Figure 11D:
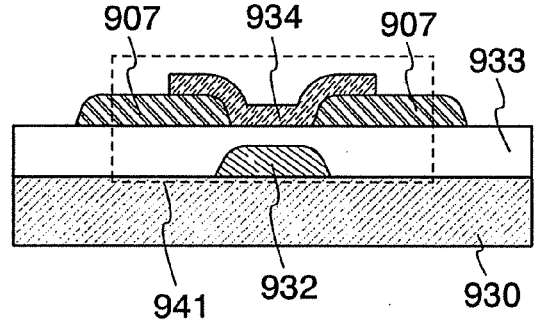

FIG. 11D shows an example of applying a coplanar organic semiconductor transistor. An organic semiconductor transistor 941 is provided over a flexible substrate 930. The organic semiconductor transistor 941 includes a gate electrode 932, an insulating layer 933 serving as a gate insulating film, and a semiconductor layer 934 which is provided in a place where the gate electrode 932 and the insulating layer 933 are overlapped. Wirings 907 are connected to the semiconductor layer 934. In addition, the wirings 907 connected to the semiconductor layer 934 are each in contact with the insulating layer serving as a gate insulating film and the semiconductor layer.

Further, the thin film transistor and the organic semiconductor transistor may be provided to have any structure as long as they can serve as switching elements. Note that the wirings 907 may be used for first conductive layers of a memory element of the present invention, or a memory element of the present invention may be connected to the wirings 907.

Furthermore, a transistor may be formed using a single crystalline substrate or an SOI substrate, and a memory element may be provided thereover. The SOI substrate may be formed by using a method in which a wafer is attached, or a method for forming an insulating layer 831 in an interior portion by implanting of an oxygen ion in a Si substrate, which is referred to as an SIMOX.

Figure 10C:
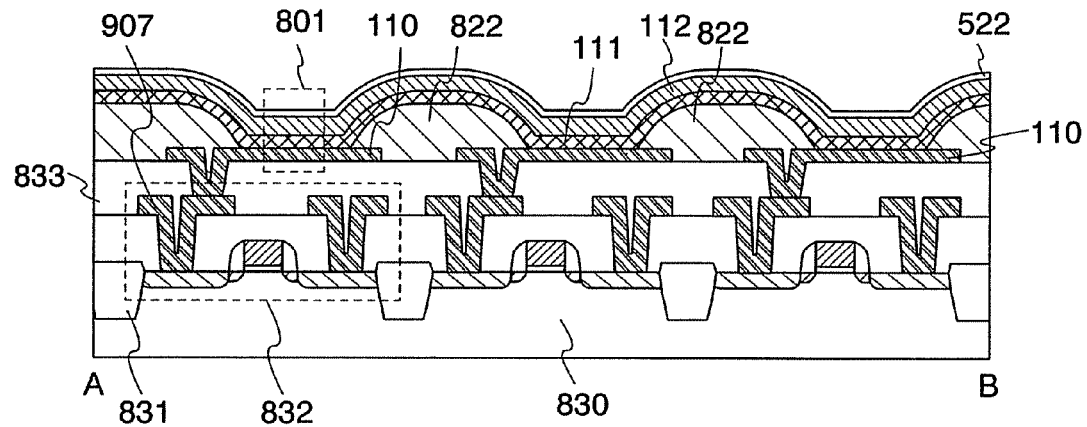

For example, when a single crystalline semiconductor is used for the substrate, as shown in FIG. 10C, a memory element 801 is connected to a field-effect transistor 832 provided using a single crystalline semiconductor substrate 830. In addition, an insulating layer 833 is provided so as to cover a wiring connected to the field-effect transistor 832, and the memory element 801 is provided over the insulating layer 833.

Since the transistor formed using such a single crystalline semiconductor has favorable characteristics of response speed and mobility, it is possible to provide a transistor which can be operated at high speed. In addition, such a transistor has slight variation in its characteristics; therefore, a highly reliable semiconductor device can be provided.

Note that the memory element 801 includes a first conductive layer 110, a memory layer 111, and a second conductive layer 112 formed over the insulating layer 833, where the memory layer 111 is interposed between the first conductive layer 110 and the second conductive layer 112.

In such a manner, the memory element 801 is formed after the insulating layer 833 is provided so that the first conductive layer 110 can be freely arranged. In other words, the memory element has to be provided in a region outside a wiring connected to the transistor, in the structure shown in FIG. 10B. However, by the insulating layer 833 being provided, it becomes possible to form, for example, the memory element 801 also above the transistor 832 as shown in FIG. 10C. As a result, a memory circuit can be integrated more highly. Naturally, the wiring 907 included in the field effect transistor 832 may be used as a first conductive layer included in a memory element.

Note that in each of the structures shown in FIGS. 10B and 10C, an example of providing a memory layer 111 continuously in the first direction (A-B) is shown; however, the memory layer 111 may be provided only above each memory cell. With such a structure, in addition, efficiency in the use of the material can be improved.

Figure 12:
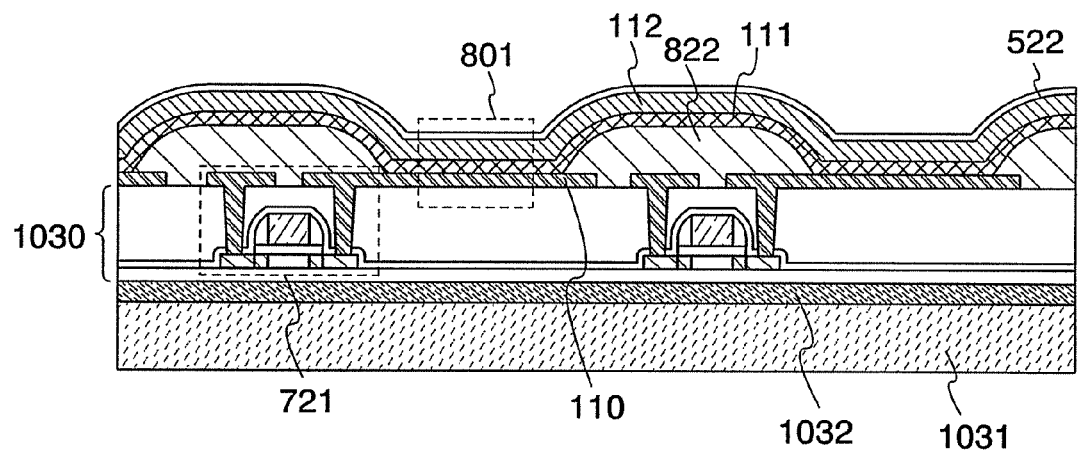
FIG. 12 is a view illustrating a structural example of a semiconductor device of the present invention.

Moreover, a separation layer is provided over a substrate and a layer 1030 having a transistor and a memory element 801 are formed over the separation layer. Thereafter, the layer 1030 having the transistor and the memory element 801 may be separated from the substrate with the use of the separation layer, and the layer 1030 having the transistor and the memory element 801 may be attached to a substrate 1031, which is different from the substrate, with the use of an adhesive layer 1032, as shown in FIG. 12. As a separating method, the following method, such methods as given below may be used: a first separating method where a metal oxide layer is provided as a separation layer between a substrate having high heat resistance and a layer having a transistor, and the metal oxide layer is weakened by crystallization so as to separate the layer having a transistor; a second separation method where an amorphous silicon film containing hydrogen is provided as a separation layer between a substrate having high heat resistance and a layer having a transistor, and the amorphous silicon film is removed by laser light irradiation or etching so as to separate the layer having a transistor; a third separating method where a substrate having high heat resistance over which a layer having a transistor is formed, is mechanically removed, or removed by etching with the use of a solution or a halogen fluoride gas such as $NF_3$, $BrF_3$, or $ClF_3$; and a fourth separating method where, a metal layer and a metal oxide layer are provided as separation layers between a substrate having high heat resistance and a layer having a transistor, the metal oxide layer is weakened by crystallization, and part of the metal layer is removed by etching with the use of a solution or a halogen fluoride gas such as $NF_3$, $BrF_3$, or $ClF_3$, and then the weakened metal oxide layer is physically separated.

When a flexible substrate, a film, paper made from a fibrous material, or the like which is like the substrate 521 described in Embodiment Mode 2 is used as the substrate 1031, a small, thin, and lightweight memory device can be realized.

Next, an operation in writing data to the memory device, that is, the semiconductor device 700 will be described with reference to FIG. 9A. As with Embodiment Mode 2, here, an operation in writing data by an electric action, typically, by voltage applied thereto will be described. Note that the data is written with the use of change of the electrical characteristics of the memory cell, and "0" and "1" refer to data in an initial state (a state where an electric action is not applied) of the memory cell and data in a state where the electrical characteristics are changed, respectively.

A case of writing data to the memory cell 701 in the x-th row and the y-th column will be described. When data "1" is written to the memory cell 701, first, the memory cell 701 is selected by the decoders 712 and 713, and the selector 714. Specifically, predetermined potential V2 is applied to the word line Wy connected to the memory cell 701 by the decoder 713. In addition, the bit line Bx connected to the memory cell 701 is connected to the reading/writing circuit 715 by the decoder 712 and the selector 714. Then, writing potential V21 is output to the bit line Bx from the reading/writing circuit 715.

The thin film transistor 721 that forms the memory cell is made in an on state in such a manner, a common electrode and the bit line are electrically connected to the memory element 722, and a voltage of about Vw (Vw=Vcom−V21) is applied. Vcom is a common electrode in the memory element 722, that is, potential of the second conductive layer. The potential Vw is appropriately selected thereby physically or electrically changing the memory layer provided between the conductive layers; thus, the data "1" is written to the memory element. Specifically, in voltage of reading operation, electric resistance between the first conductive layer and the second conductive layer in the state of the data "1" is preferably reduced significantly as compared to a case of being in a state of the data "0", and short circuit may simply be made to occur between the first conductive layer and the second conductive layer. Note that the voltage Vw may be greater than or equal to 5 V and less than or equal to 15 V or greater than or equal to −15 V and less than or equal to −5 V, for example.

Note that non-selected word lines and non-selected bit lines are controlled so that the data "1" is not written to the memory cells connected to the non-selected word and bit lines. Specifically, a potential which turns off transistors of memory cells connected to the non-selected word lines are made in an off state, may be applied to the non-selected word lines or potential which is the same level as Vcom may be applied.

On the other hand, when data "0" is written to the memory cell 701, an electric action may not be applied to the memory cell 701. As for a circuit operation, for example, the memory cell 701 is selected by the decoders 712 and 713, and the selector 714 as well as the case of writing data "1"; however, the output potential from the reading/writing circuit 715 to the bit line Bx is set to be the same degree as Vcom or to be a potential whereby the thin film transistor 721 of the memory cell is made in an off state. As a result, low voltage (for example, −5 V to 5 V) is applied to the memory element 722 or no voltage is applied to the memory element 722; therefore, electrical characteristics of the memory element are not changed and writing of the data "0" can be realized.

Next, an operation in reading data by an electric action will be described with reference to FIG. 9B. Data is read by utilization of difference in electrical characteristics of the memory elements 722, which are different between a memory cell having data "0" and another memory cell having data "1". For example, a method for reading data by utilization of difference in electric resistance will be described under conditions where electric resistance of a memory element that forms a memory cell having the data "0" is set to be R0 at a reading voltage, and electric resistance of a memory element that forms a memory cell having the data "1" is set to be R1 at a reading voltage. Note that R1<<R0. As a structure of a read portion of the reading/writing circuit 715, for example, a circuit using a resistance element 750 and a differential amplifier 751 which is shown in FIG. 9B can be considered. The resistance element has a resistance value Rr, where R1<Rr<R0. Instead of the resistance element 750, a transistor 752 may be used as shown in FIG. 9C or a clocked inverter 753 can also be used instead of the differential amplifier 751. Of course, the circuit configuration is not limited to FIGS. 9B and 9C.

When data is read from a memory cell 702 in the x-th row and the y-th column, first, the memory cell 702 is selected by decoders 712 and 713, and a selector 714. Specifically, predetermined potential V24 is applied to a word line Wy connected to the memory cell 702 by the decoder 713, and the thin film transistor 721 is turned on. A bit line Bx connected to the memory cell 702 is connected to a terminal P of the reading/writing circuit 715 by the decoder 712 and the selector 714. As a result, potential Vp of the terminal P becomes a value determined by resistor division of Vcom and V0 with the use of the resistance element 750 (a resistance value: Rr) and the memory element 722 (a resistance value: R0 or R1). Therefore, in a case where the memory cell 702 has the data "0", potential Vp0 of the terminal P is Vp0=Vcom+(V0−Vcom)×R0/(R0+Rr). When the memory cell 702 has the data "1", potential Vp1 of the terminal P is Vp1=Vcom+(V0−Vcom)×R1/(R1+Rr). As a result, by selection of Vref to be between Vp0 and Vp1 in FIG. 9B and selection of a change point of the clocked inverter to be between Vp0 and Vp1 in FIG. 9C, Low/High (or High/Low) of an output potential Vout is output in accordance with the data "0" or data "1", and hence, the data can be read.

For example, it is assumed that the differential amplifier 751 is operated at Vdd=3 V, and Vcom is set to be 0 V; V0, 3 V; and Vref, 1.5 V. If R0/Rr=Rr/R1=9 and on-resistance of the thin film transistor 721 can be ignored, in a case where a memory cell has the data "0", Vp0 becomes 2.7 V and High is output as Vout. Meanwhile, in a case where a memory cell has the data "1", Vp1 becomes 0.3 V and Low is output as Vout. In such a manner, reading of memory cells can be performed.

According to the above method, data is read by the amount of voltage while utilization of a difference in resistance value of the memory elements 722 and resistor division. Of course, the method for reading data is not limited to this method. For example, data may be read by utilization of difference in the amount of current besides utilization of difference in electric resistance. Moreover, data may also be read by utilization of difference in threshold voltage when the electrical characteristics of the memory cells have diode characteristics which are different in threshold voltage between a memory cell having data "0" and another memory cell having data "1".

In addition, a thin film transistor (TFT) may be provided over a substrate having an insulating property, and the memory element or a memory element array may be provided thereover. Alternatively, instead of the substrate having an insulating property, a semiconductor substrate such as a Si substrate or an SOI substrate may be used to form a field-effect transistor (FET) over the substrate, and the memory element or a memory element array may be provided thereovel Regarding the semiconductor device described in this embodiment mode, data can be written to the semiconductor device not only once but can also be written additionally. Since data once written to a memory element cannot be erased, it is possible to prevent forgery by rewriting. Further, since the semiconductor includes a memory element of the present invention, which can be manufactured simply with high yield, a semiconductor with excellent performance and reliability can be manufactured inexpensively.

Note that this embodiment mode can be combined with any of the other embodiment modes and embodiments as appropriate. Therefore, in a memory element included in the semiconductor device described in this embodiment mode, for example, an insulating layer or a semiconductor layer may be provided between a memory layer and at least one of a first conductive layer and a second conductive layer.

Embodiment Mode 4

This embodiment mode will describe a structural example of a semiconductor device having the memory device which is described in the above embodiment modes, with reference to the drawings.

One feature of the semiconductor device described in this embodiment mode is that data can be read from and written to the semiconductor device without contact. Data transmitting methods can be largely classified into three of an electromagnetic coupling method in which a pair of coils is placed to face each other and communication is performed by mutual induction; an electromagnetic induction method in which communication is performed by an induction field; and a radio wave method in which communication is performed by utilization of radio waves, and any type can be employed. Moreover, there are two types of layouts of an antenna used for transmitting data: one is a case where an antenna is provided over a substrate over which a transistor and a memory element are provided; and the other is a case where a terminal portion is provided over a substrate over which a transistor and a memory element are provided and an antenna, which is provided over the other substrate, is connected to the terminal portion.

Figure 13A:
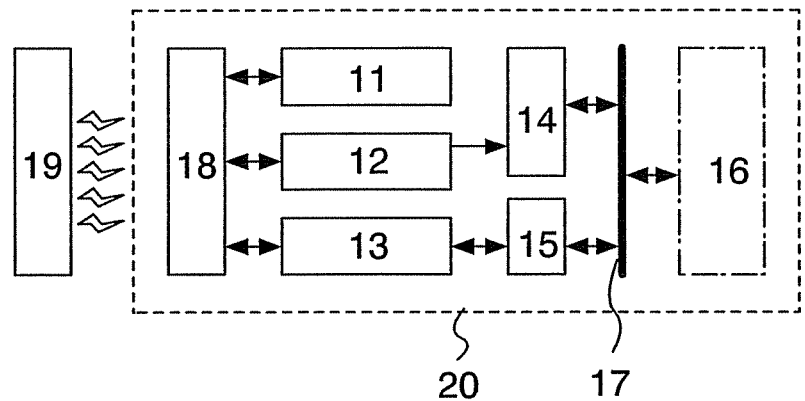
FIGS. 13A to 13C are diagrams each illustrating a structural example of a semiconductor device of the present invention.

Structures of semiconductor devices described in this embodiment mode will be described with reference to FIGS. 13A to 13C. As shown in FIG. 13A, a semiconductor device 20 of the present invention has a function of receiving/sending data without contact, and includes a power supply circuit 11, a clock generation circuit 12, a data demodulation/modulation circuit 13, a control circuit 14 controlling other circuits, an interface circuit 15, a memory circuit 16, a bus 17, and an antenna 18.

Figure 13B:
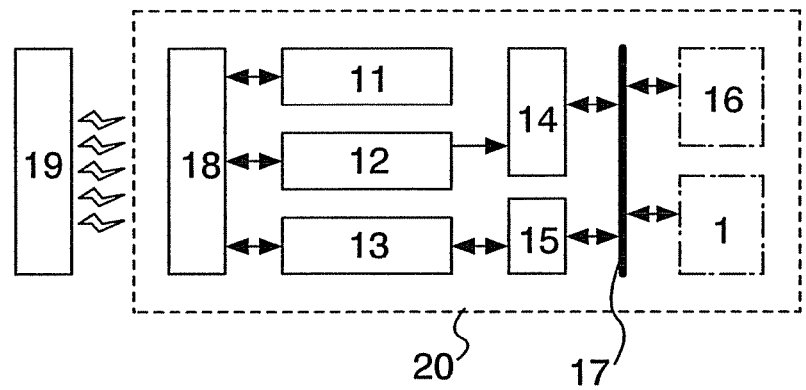

In addition, as shown in FIG. 13B, the semiconductor device 20 of the present invention has a function of receiving/sending data without contact, and may include a central processing unit 1, in addition to the power supply circuit 11, the clock generation circuit 12, the data demodulation/modulation circuit 13, the control circuit 14 controlling other circuits, the interface circuit 15, the memory circuit 16, the bus 17, and the antenna 18.

Figure 13C:
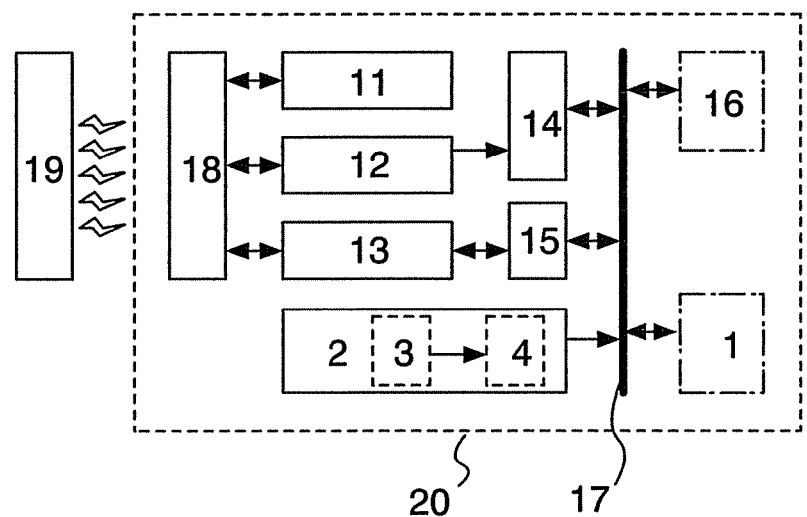

As shown in FIG. 13C, the semiconductor device 20 of the present invention has a function of receiving/sending data without contact, and may include a detecting portion 2 including a detecting element 3 and a detection circuit 4, in addition to the power supply circuit 11, the clock generation circuit 12, the data demodulation/modulation circuit 13, the control circuit 14 controlling other circuits, the interface circuit 15, the memory circuit 16, the bus 17, the antenna 18, and the central processing unit 1.

The power supply circuit 11 generates various kinds of power sources to be supplied to each circuit inside the semiconductor device 20 based on alternating current signals input from the antenna 18. The clock generation circuit 12 generates various clock signals to be supplied to each circuit inside the semiconductor device 20 based on alternating current signals input from the antenna 18. The data demodulation/modulation circuit 13 includes a function of demodulating/modulating data for communicating with a reader/writer 19. The control circuit 14 has a function of controlling the memory circuit 16. The antenna 18 has a function of sending and receiving electromagnetic fields or radio waves. The reader/writer 19 controls communication with the semiconductor device and processing of data of communication. Note that the semiconductor device is not limited to the above structures. For example, the semiconductor device may further include other elements such as a limiter circuit of power supply voltage and hardware for encryption processing.

The memory circuit 16 includes one or a plurality of memory elements selected from the memory elements described in Embodiment Mode 1. Using a memory element of the present invention, a memory circuit can be manufactured simply with high yield.

Moreover, the chance of writing data to the memory element is not only once but can also be written additionally. On the other hand, since it is impossible to erase data of a memory element where writing is once performed, it is possible to prevent forgery by rewriting. Accordingly, a semiconductor device with high performance and reliability can be manufactured inexpensively.

The detecting portion 2 can detect temperature, pressure, flow rate, light, magnetism, sonic waves, acceleration, humidity, a gas component, a fluid component, and other characteristics by a physical means or a chemical means. The detecting portion 2 includes the detecting element 3 for detecting a physical quantity or a chemical quantity and the detection circuit 4, which converts a physical quantity or a chemical quantity detected by the detecting element 3 into a suitable signal such as an electrical signal. The detecting element 3 can be formed using a resistance element, a capacitance coupled element, an inductively coupled element, a photovoltaic element, a photoelectric conversion element, a thermovoltaic element, a transistor, a thermistor, a diode, or the like. Note that a plurality of detecting portions 2 may be provided. In this case, a plurality of physical quantities or chemical quantities can be detected simultaneously.

Further, the physical quantities mentioned here indicate temperature, pressure, flow rate, light, magnetism, sonic waves, acceleration, humidity, and the like. The chemical quantities mentioned here indicate chemical substances and the like such as a gas component like a gas and a fluid component like an ion. In addition to the above, the chemical quantities further include an organic compound like a certain biologic substance contained in blood, sweat, urine, and the like (for example, a blood-sugar level contained in blood). In particular, in order to detect a chemical quantity, a certain substance is inevitably detected selectively, and therefore, a substance which selectively reacts with the substance to be detected is provided in advance in the detecting element 3. For example, when detecting a biologic substance, enzyme, an antibody, a microbial cell, or the like, which selectively reacts with the biologic substance to be detected by the detecting element 3, is preferably immobilized to a high molecule and the like.

Figure 14A:
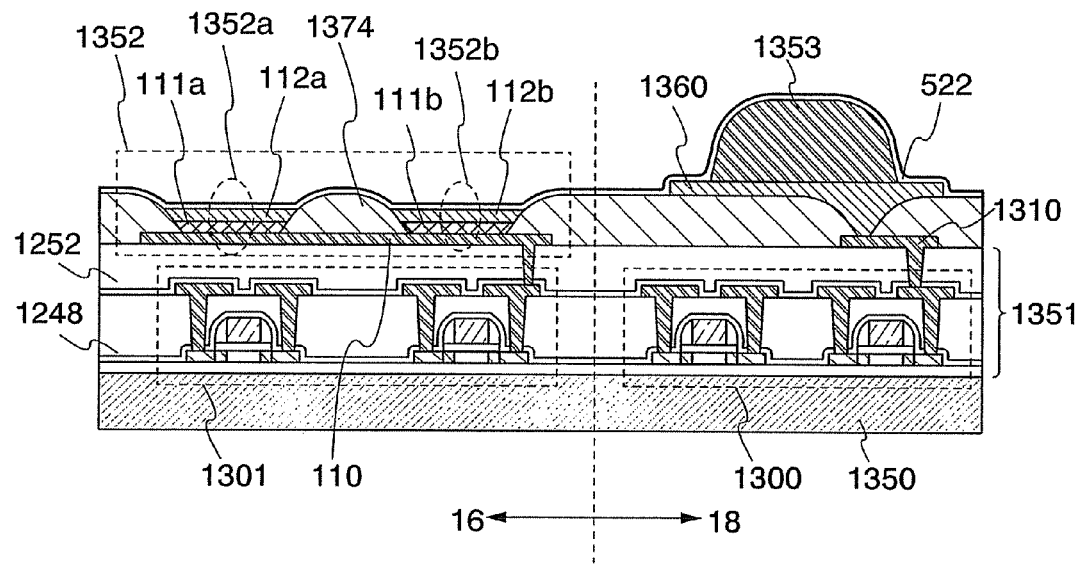
FIGS. 14A and 14B are views each illustrating part of a cross section of a semiconductor device of the present invention.
Figure 14B:
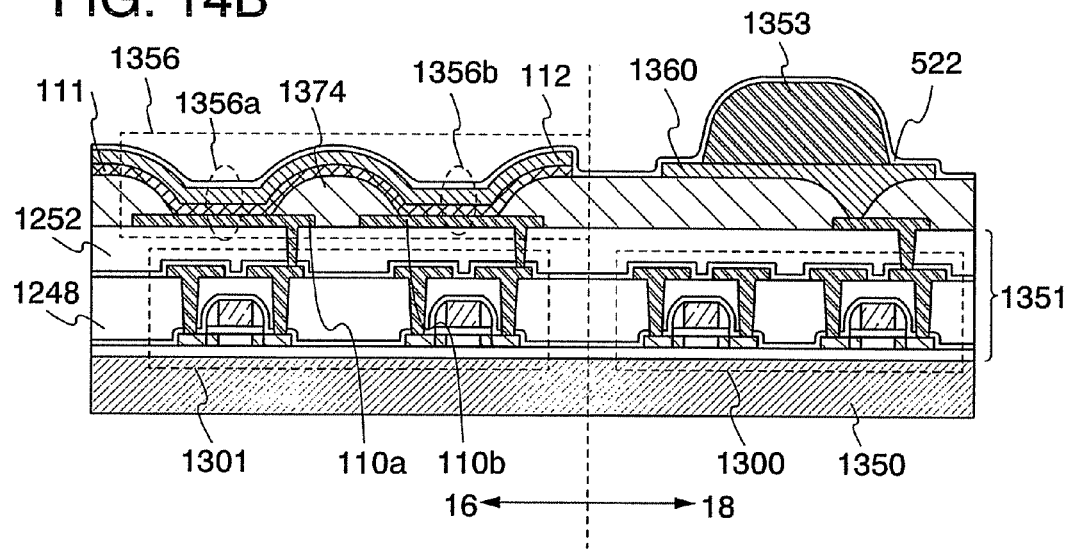

Next, FIGS. 14A and 14B each show a structural example of a semiconductor device provided with an antenna over a substrate provided with a plurality of elements and a memory element. Note that FIGS. 14A and 14B each show a cross-sectional view of the memory circuit 16 and the antenna 18.

FIG. 14A shows a semiconductor device having a passive matrix type memory circuit. Over a substrate 1350, the semiconductor device includes a layer 1351 having transistors 1300 and 1301, a memory element portion 1352 formed above the layer 1351 having the transistors, and a conductive layer 1353 serving as an antenna.

Note that a case where the semiconductor device includes the memory element portion 1352 and the conductive layer 1353 serving as an antenna above the layer 1351 having the transistors; however, the present invention is not limited to this structure. The memory element portion 1352 or the conductive layer 1353 serving as an antenna may be provided below or in the same layer as the layer 1351 having the transistors.

The memory element portion 1352 has a plurality of memory elements 1352a and 1352b. The memory element 1352a includes a first conductive layer 110 provided over an insulating layer 1252, a memory layer 111a provided over the first conductive layer 110, and a second conductive layer 112a. Further, the memory element 1352b includes the first conductive layer 110 provided over the insulating layer 1252, a memory layer 111b provided over the first conductive layer 110, and a second conductive layer 112b. Note that the memory elements 1352a and 1352b are separated from each other by a partition wall (insulating layer) 1374.

The first conductive layer 111 in the memory element portion 1352 is connected to a wiring, and the wiring is connected to the transistor 1301. The memory element portion 1352 can be formed using a material and a manufacturing method similar to those of the memory element described in the above embodiment modes. Further, an insulating layer 522 is formed, which serves as a protective film so as to cover the second conductive layers 112a and 112b and the conductive layer 1353 serving as an antenna.

Note that the conductive layer 1353 serving as an antenna is provided over the conductive layer 1360. The conductive layer 1360 is connected to the transistor 1300 through a wiring 1310 which is formed in the same step as the first conductive layer 110 of the memory element portion 1352. Further, a layer in the same level as the second conductive layers 112a and 112b may be used as a conductive layer serving as an antenna.

The conductive layer 1353 serving as an antenna is formed from a conductive material by a CVD method, a sputtering method, a printing method such as screen printing or gravure printing, a droplet discharge method, a dispenser method, a plating method, or the like. As for the conductive material, an element selected from aluminum (Al), titanium (Ti), silver (Ag), copper (Cu), gold (Au), platinum (Pt), nickel (Ni), palladium (Pd), tantalum (Ta), or molybdenum (Mo) or an alloy material or a compound material containing these elements as its main component is formed in a single-layer or stacked-layer structure.

When the conductive layer serving as an antenna is formed by a screen printing method, for example, a conductive paste where conductive particles each having a grain size of several nm to several tens of μm, are dissolved or dispersed in an organic resin is selectively printed on a desired region so that the conductive layer serving as an antenna can be provided. As each conductive particle, any one or more of metal particles of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersive nanoparticles can be used. In addition, as the organic resin included in the conductive paste, one or a plurality of organic resins each serving as a binder, a solvent, a dispersant, or a coating member of the metal particle can be used. Typically, an organic resin such as an epoxy resin or a silicone resin can be used. When forming the conductive layer, baking is preferably performed after the conductive paste is pushed out. For example, when fine particles (for example, the grain size of 1 nm to 100 nm) containing silver as its main component are used, as a material of the conductive paste, the conductive layer can be obtained by being cured by baking at temperatures of 150° C. to 300° C. Alternatively, fine particles containing solder or lead-free solder as its main component may be used. In this case, it is preferable to use fine particles each having a grain size of less than or equal to 20 μm. Solder or lead-free solder has an advantage of low cost. Moreover, besides the above materials, ceramic, ferrite, or the like may be applied.

The transistors described in Embodiment Mode 3 or the like can be appropriately selected and used for the transistors 1300 and 1301 included in the layer 1351 having the transistors.

Moreover, a separation layer is provided over the substrate; the layer 1351 having the transistors, the memory element portion 1352, and the conductive layer 1353 serving as an antenna are formed over the separation layer; and the layer 1351 having the transistors, the memory element portion 1352, and the conductive layer 1353 serving as an antenna are appropriately separated using the separating method described in Embodiment Mode 3, which may be attached over a substrate with the use of an adhesive layer. As the substrate, a flexible substrate, a film, paper made from a fibrous material, or the like which is described as the substrate 521 in Embodiment Mode 2 is used so that it is possible to achieve a small, thin, and lightweight memory device.

FIG. 14B shows an example of a semiconductor device having an active matrix type memory circuit. Note that portions in FIG. 14B which are different from those in FIG. 14A will be described.

Over a substrate 1350, the semiconductor device shown in FIG. 14B includes a layer 1351 having transistors 1300 and 1301, a memory element portion 1356 and a conductive layer 1353 serving as an antenna above the layer 1351 having the transistors. Note that a case where the memory element portion 1356 and the conductive layer 1353 serving as an antenna are formed above the layer 1351 having the transistors; however, the present invention is not limited to this structure. The memory element portion 1356 and the conductive layer 1353 serving as an antenna may be formed above or below the layer 1351 having the transistor 1301 or can be formed below or in the same layer as the layer 1351 having the transistors.

The memory element portion 1356 includes memory elements 1356a and 1356b. A memory element 1356a includes a first conductive layer 110a formed over an insulating layer 1252, a memory layer 111 provided over the first conductive layer 110a, and a second conductive layer 112. A memory element 1356b includes a first conductive layer 110b formed over the insulating layer 1252, the memory layer 111 provided over the first conductive layer 110b, and the second conductive layer 112. Note that the memory elements 1356a and 1356b are separated from each other by a partition wall (insulating layer) 1374, and the memory element portion 1356 may be formed from the same material or by the same manufacturing method as the memory element described in the above embodiment mode. Further, a wiring is connected to a transistor, and is connected to each of first conductive layers of a memory element. Specifically, memory elements are each connected to one of transistors. Note that also in a cross-sectional direction shown in FIG. 14B, the memory layer 111 may be separated by each memory element.

In addition, a separation layer is provided over the substrate; the layer 1351 having the transistors, the memory element portion 1356, and the conductive layer 1353 serving as an antenna are formed over the separation layer; and the layer 1351 having the transistors, the memory element portion 1356, and the conductive layer 1353 serving as an antenna are appropriately separated using the separating method described in Embodiment Mode 3, which may be attached over a substrate with the use of an adhesive layer.

Next, a structural example of a semiconductor device including a first substrate including a layer having transistors, a terminal portion being connected to the antenna, and a memory element, and a second substrate over which an antenna being connected to the terminal portion is formed will be described with reference to FIGS. 15A and 15B. Note that portions in FIGS. 15A and 15B which are different from those in FIGS. 14A and 14B will be described.

Figure 15A:
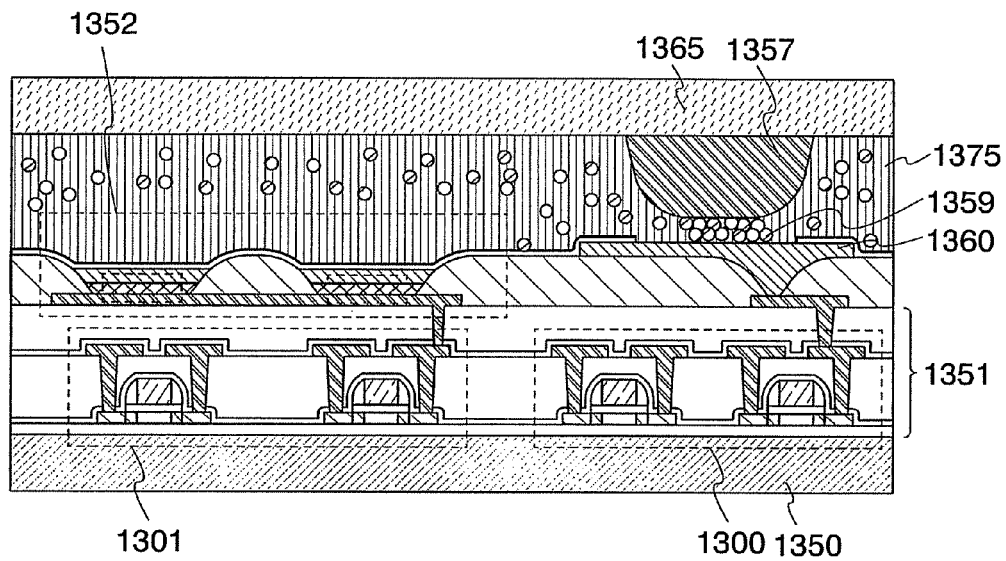
FIGS. 15A and 15B are views each illustrating part of a cross section of a semiconductor device of the present invention.

FIG. 15A shows a semiconductor device having a passive matrix type memory device. The semiconductor device includes a layer 1351 having transistors 1300 and 1301, a memory element portion 1352 formed above the layer 1351 having the transistors formed over a substrate 1350, a terminal portion connected to an antenna, and a substrate 1365 over which a conductive layer 1357 serving as an antenna is formed. The conductive layer 1357 and a conductive layer 1360 to be a connection terminal are electrically connected to each other by conductive particles 1359 contained in a resin 1375. Note that the substrate 1350 including the layer 1351 having the transistors, the memory element portion 1352, and the like and the substrate 1365 provided with the conductive layer 1357 serving as an antenna are attached to each other by the resin 1375 having an adhesive property.

The conductive layer 1357 serving as an antenna and the conductive layer 1360 to be a connection terminal may be connected to each other using a conductive adhesive such as a silver paste, a copper paste, and a carbon paste or a solder joint method. Note that a case in which the memory element portion 1352 is provided above the layer 1351 having the transistors is shown here; however, the present invention is not limited to this structure. The memory element portion 1352 may be provided below or in the same layer as the layer 1351 having the transistors.

Figure 15B:
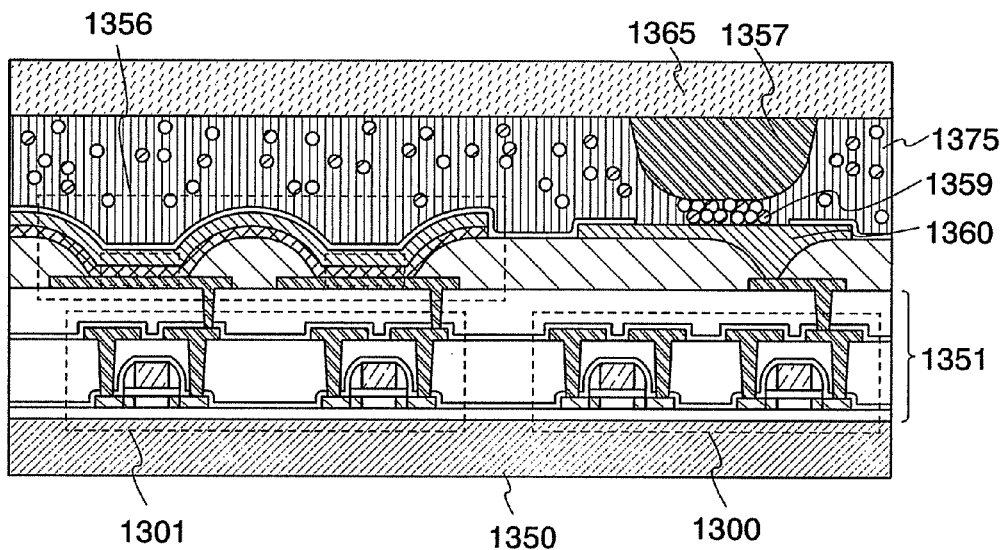
Figure 17A:
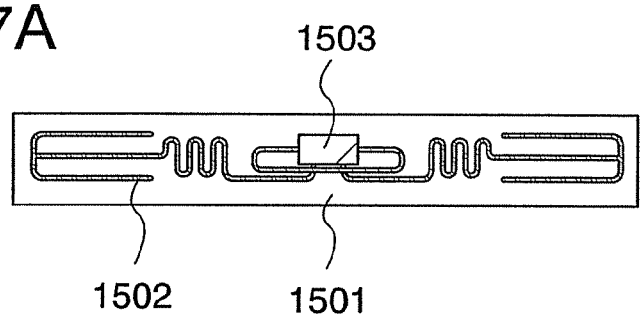
FIGS. 17A to 17D are views each illustrating a chip-like semiconductor device of the present invention.
Figure 17B:
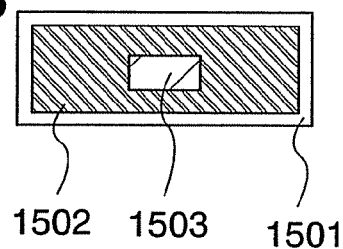
Figure 17C:
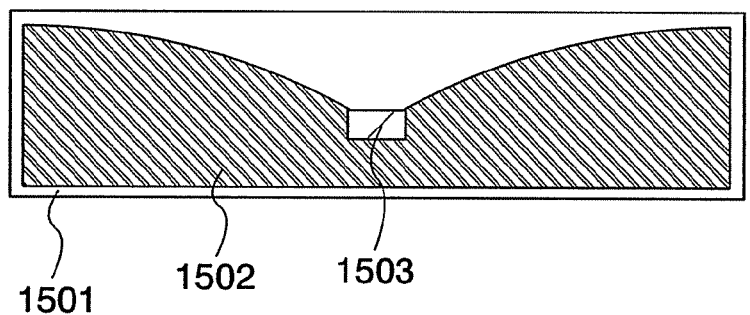
Figure 17D:
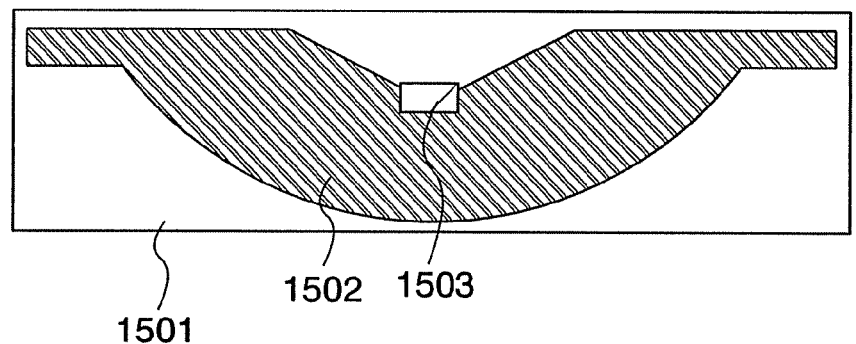

FIG. 15B shows a semiconductor device having an active matrix type memory device. The semiconductor device includes a layer 1351 having transistors 1300 and 1301 formed over a substrate 1350, a memory element portion 1356 formed above the layer 1351 having the transistors, a terminal portion connected to the transistors, and a substrate 1365 over which a conductive layer 1357 serving as an antenna is formed. The conductive layer 1357 and a conductive layer 1360 to be a connection terminal are connected to each other by conductive particles 1359 contained in a resin 1375. Note that the substrate 1350 including the layer 1351 having the transistors, the memory element portion 1356, and the like and the substrate 1365 provided with the conductive layer 1357 serving as an antenna are attached to each other by the resin 1375 having an adhesive property.

The substrate 1350 including the layer 1351 having the transistors, the memory element portion 1356, and the like and the substrate 1365 provided with the conductive layer 1357 serving as an antenna may be connected to each other using a conductive adhesive such as a silver paste, a copper paste, and a carbon paste or a solder joint method. Note that a case in which the memory element portion 1352 is provided above the layer 1351 having the transistors is shown here; however, the present invention is not limited to this structure. The memory element portion 1356 may be provided below or in the same layer as the layer 1351 having the transistors.

In addition, a separation layer is provided over the substrate; the layer 1351 having the transistors and the memory element portion 1352 or 1356 are formed over the separation layer; and the layer 1351 having the transistors and the memory element portions 1352 and 1356 are appropriately separated using the separating method described in Embodiment Mode 3, which may be attached over a substrate with the use of an adhesive layer.

Further, each of the memory element portions 1352 and 1356 may be provided over the substrate 1365 provided with the conductive layer 1357 serving as an antenna. In other words, a first substrate, over which a layer having transistors is provided, and a second substrate, over which a memory element portion and a conductive layer serving as an antenna are provided, may be attached to each other with the use of a resin containing conductive particles. A sensor being connected to the transistors may also be provided as well as the semiconductor devices shown in FIGS. 14A and 14B.

Regarding the semiconductor device described in this embodiment mode, data can be written to the semiconductor device not only once but can also be written additionally. Since data once written to a memory element cannot be erased, it is possible to prevent forgery by rewriting. Further, since the semiconductor includes a memory element of the present invention, which can be manufactured simply with high yield, a semiconductor with excellent performance and reliability can be manufactured inexpensively.

Note that this embodiment mode can be combined with any of the other embodiment modes and embodiments as appropriate. Therefore, in a memory element included in the semiconductor device described in this embodiment mode, for example, an insulating layer or a semiconductor layer may be provided between a memory layer and at least one of a first conductive layer and a second conductive layer.

Embodiment Mode 5

This embodiment mode will describe an example of a semiconductor device having the memory element of the present invention with reference to the drawings. FIG. 16A shows a top view of the semiconductor device of this embodiment mode, and FIG. 16B shows a cross-sectional view taken along line X-Y in FIG. 16A.

As shown in FIG. 16A, a memory element portion 1404 having a memory element, a circuit portion 1421, and an antenna 1431 are formed over a substrate 1400. States shown in FIGS. 16A and 16B are in the middle of a manufacturing process, in which the memory element portion, the circuit portion, and the antenna have been formed over the substrate 1400 capable of resisting the manufacturing condition. The material and manufacturing process may appropriately be selected in a manner similar to the above embodiment modes for manufacturing.

Over the substrate 1400, a transistor 1441 is provided in the memory element portion 1404 while a transistor 1442 is provided in the circuit portion 1421, with a separation layer 1452 and an insulating layer 1453 interposed therebetween. Insulating layers 1461, 1454, and 1455 are formed over the transistors 1441 and 1442, and a memory element 1443 is formed over the insulating layer 1455.

The memory element 1443 includes a first conductive layer 110d, a memory layer 111, and a second conductive layer 112, which are provided over the insulating layer 1455. The memory layer 111 is provided between the first conductive layer 110d and the second conductive layer 112. Note that the memory element 1443 can be formed using the same material or the same manufacturing method as the memory element described in the above embodiment mode. Although omitted in FIGS. 16A and 16B, a plurality of memory elements 1443 is separated from each other by insulating layers 1460b serving as partition walls.

The first conductive layer 110d is connected to the transistor 1441 through a wiring layer. On the other hand, the second conductive layer 112 is connected to a conductive layer 1457c stacked on a wiring layer 1456a. In addition, a conductive layer and the antenna 1431 shown in FIG. 16A are provided over the insulating layer 1455 by being stacked together. In FIG. 16B, the conductive layer corresponds to conductive layers 1457a, 1457b, 1457e, and 1457f, and the conductive layers 1457a, 1457b, and 1457f are stacked with antennas 1431a, 1431b, and 1431d, respectively. Note that the conductive layer 1457e and an antenna 1431c are each formed in an opening portion that reaches a wiring layer 1456b which is formed in the insulating layer 1455, and the conductive layer 1457e and the wiring layer 1456b are connected to each other. In such a manner, the antennas are electrically connected to the memory element portion 1404 and the circuit portion 1421. In addition, the conductive layers 1457a, 1457b, 1457e, and 1457f formed under the antennas 1431a, 1431b, 1431c, and 1431d, respectively, also have an effect of improving adhesiveness between the insulating layer 1455 and the antennas. In this embodiment mode, a polyimide film is used for the insulating layer 1455, a titanium film is used for each of the conductive layers 1457a, 1457b, 1457e, and 1457f, and an aluminum film is used for each of the antennas 1431a, 1431b, 1431c, and 1431d.

Openings (also referred to as contact holes) are formed in the insulating layer 1455 so that the first conductive layer 110d and the transistor 1441, the conductive layer 1457c and the wiring layer 1456a, and the conductive layer 1457e and the wiring layer 1456b are connected to each other. Since resistance is decreased as the contact area between conductive layers are increased by enlargement of the opening, the openings are set in this embodiment mode so that the opening for connecting the first conductive layer 110d to the transistor 1441 is the smallest, the opening for connecting the conductive layer 1457c to the wiring layer 1456a is followed, and the opening for connecting the conductive layer 1457e to the wiring layer 1456b is the largest. In this embodiment mode, the opening for connecting the first conductive layer 110d to the transistor 1441 is 5 μm×5 μm, the opening for connecting the conductive layer 1457c to the wiring layer 1456a is 50 μm×50 μm, and the opening for connecting the conductive layer 1457e to the wiring layer 1456b is 500 μm×500 μm.

In this embodiment mode, distance a from an insulating layer 1460a to the antenna 1431b is greater than or equal to 500 μm, distance b from an end portion of the second conductive layer 112 to an end portion of the insulating layer 1460a is greater than or equal to 250 μm, distance c from an end portion of the second conductive layer 112 to an end portion of an insulating layer 1460c is greater than or equal to 500 μm, and distance d from the end portion of the insulating layer 1460c to the antenna 1431c is greater than or equal to 250 μm. The insulating layer 1460c is formed partially in the circuit portion 1421; thus, one part of the transistor 1442 is covered with the insulating layer 1460c and the other part thereof is not covered with the insulating layer 1460c.

With the use of such a semiconductor device, a power supply voltage or a signal is directly input to the memory element portion 1404 from an external input portion so that data (corresponding to information) can be written to the memory element portion 1404 or read from the memory element portion 1404.

Moreover, the antenna may be provided either so as to overlap the memory element portion or so as to surround the memory element portion without the memory element portion being overlapped. When the antenna overlaps, the antenna may overlap the memory element portion either entirely or partially. For example, a structure where an antenna portion and a memory element portion overlap can reduce a defective operation of a semiconductor device caused by noise superposed on a signal when communication is performed by the antenna, or fluctuation or the like of electromotive force generated by electromagnetic induction.

As a signal transmission method in the above semiconductor device capable of inputting and outputting data in a non-contact manner, an electromagnetic coupling method, an electromagnetic induction method, a microwave method, or the like can be used. The transmission method can be appropriately selected in consideration of an intended use, and an optimum antenna may be provided in accordance with the transmission method.

FIGS. 17A to 17D each show an example of a chip-like semiconductor device including a conductive layer 1502 serving as an antenna and a memory element portion 1503 which are formed over a substrate 1501. Note that an integrated circuit or the like in addition to the memory element may be mounted on the semiconductor device.

When a microwave method (for example, an UHF band (a 860 to 960 MHz band), a 2.45 GHz band, or the like) is applied as the signal transmission method in the semiconductor device, the shape such as the length of the conductive layer serving as an antenna may be appropriately set in consideration of the wavelength of an electromagnetic wave used for signal transmission. For example, the conductive layer serving as an antenna can be formed in a linear shape (for example, a dipole antenna (see FIG. 17A)), a flat shape (for example, a patch antenna (see FIG. 17B)), a ribbon shape (see FIGS. 17C and 17D), or the like. The shape of the conductive layer serving as an antenna is not limited to the form of a line, and the conductive layer serving as an antenna may also be provided in the form of a curve, a meander, or a combination of them, in consideration of the wavelength of the electromagnetic wave.

In addition, when an electromagnetic coupling method or an electromagnetic induction method (for example, a 13.56 MHz band) is applied as the signal transmission method in the semiconductor device, electromagnetic induction caused by change in magnetic field density is utilized; therefore, a conductive layer serving as an antenna is preferably formed in an annular shape (for example, a loop antenna) or a spiral shape (for example, a spiral antenna).

In addition, even when an electromagnetic coupling method or an electromagnetic induction method is applied and a semiconductor device having an antenna is provided in contact with metal, a magnetic material having magnetic permeability is preferably provided between the semiconductor device and the metal. When a semiconductor device having an antenna is provided in contact with metal, eddy current flows through the metal in accordance with change in magnetic field, and a demagnetizing field generated by the eddy current impairs the change in magnetic field to reduce the communication distance. Therefore, by a material having magnetic permeability being provided between the semiconductor device and the metal, eddy current of the metal can be suppressed; thus, reduction in communication distance can be suppressed. Note that ferrite or a metal thin film having high magnetic permeability and little loss of high frequency wave can be used as the magnetic material.

Moreover, when providing an antenna, a semiconductor element such as a transistor and a conductive layer serving as an antenna may be directly formed on one substrate, or alternatively, a semiconductor element and a conductive layer serving as an antenna may be separately provided over different substrates and then attached to be electrically connected to each other.

Regarding the semiconductor device described in this embodiment mode, data can be written to the semiconductor device not only once but can also be written additionally. Since data once written to a memory element cannot be erased, it is possible to prevent forgery by rewriting. Further, since the semiconductor includes a memory element of the present invention, which can be manufactured simply with high yield, a semiconductor with excellent performance and reliability can be manufactured inexpensively.

Note that this embodiment mode can be combined with any of the other embodiment modes and embodiments as appropriate. For example, in a memory element included in the semiconductor device described in this embodiment mode, an insulating layer or a semiconductor layer may be provided between a memory layer and at least one of a first conductive layer and a second conductive layer.

Embodiment Mode 6

Figure 18A:
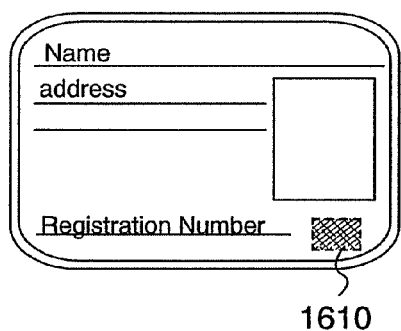
FIGS. 18A to 18F are views each illustrating an article mounted with a semiconductor device of the present invention.
Figure 18B:
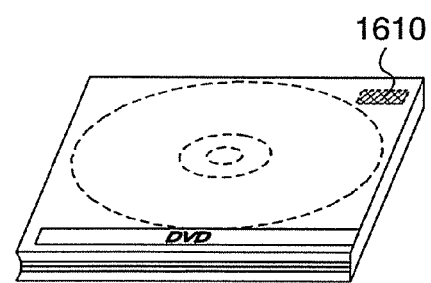
Figure 18C:
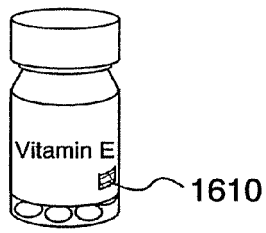
Figure 18D:
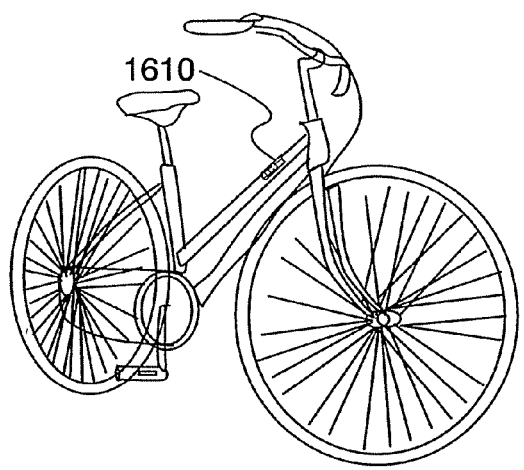
Figure 18E:
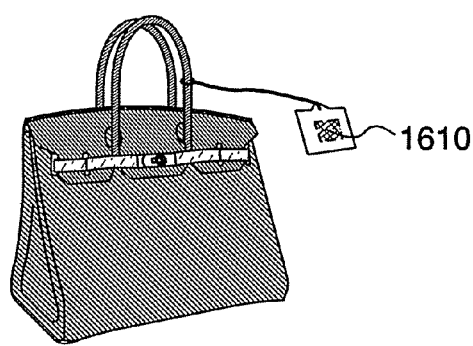
Figure 18F:
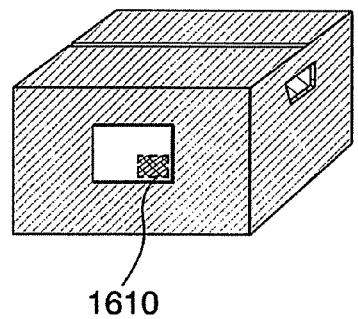

According to the present invention, a semiconductor device serving as a wireless chip can be formed. Although a wireless chip can be used broadly, it may be used by being mounted on products such as bills, coins, securities, bearer bonds, certificates (driver's licenses, resident cards, or the like, see FIG. 18A), containers for wrapping objects (wrapping paper, bottles, or the like, see FIG. 18C), recording media (DVDs, video tapes, or the like, see FIG. 18B), vehicles (bicycles or the like, see FIG. 18D), personal belongings (bags, glasses, or the like), foods, plants, animals, human bodies, clothes, livingware, or electronic devices, or objects such as shipping tags of baggage (see FIGS. 18E and 18F). The electronic device includes a liquid crystal display device, an EL display device, a television device (also simply referred to as a TV, a TV receiver, or a television receiver), a cellular phone, and the like.

A semiconductor device 1610 of the present invention, having a memory element of the present invention, is mounted on a printed substrate, attached to a surface, or incorporated to be fixed in an object. For example, the semiconductor device is incorporated in paper of a book or an organic resin of a package to be fixed in each object. As for the semiconductor device 1610 of the present invention, a small size, a thin shape, and lightweight are achieved and an attractive design of the object itself is not damaged even after being fixed in the object. In addition, by the semiconductor device 1610 of the present invention being provided in bills, coins, securities, bearer bonds, certificates, or the like, a certification function can be obtained and forgery thereof can be prevented by the use of the certification function being made. Further, by the semiconductor device 1610 of the present invention being provided in containers for wrapping objects, recording media, personal belongings, foods, clothes, livingware, electronic devices, or the like, a system such as an inspection system can be performed efficiently.

Figure 19:
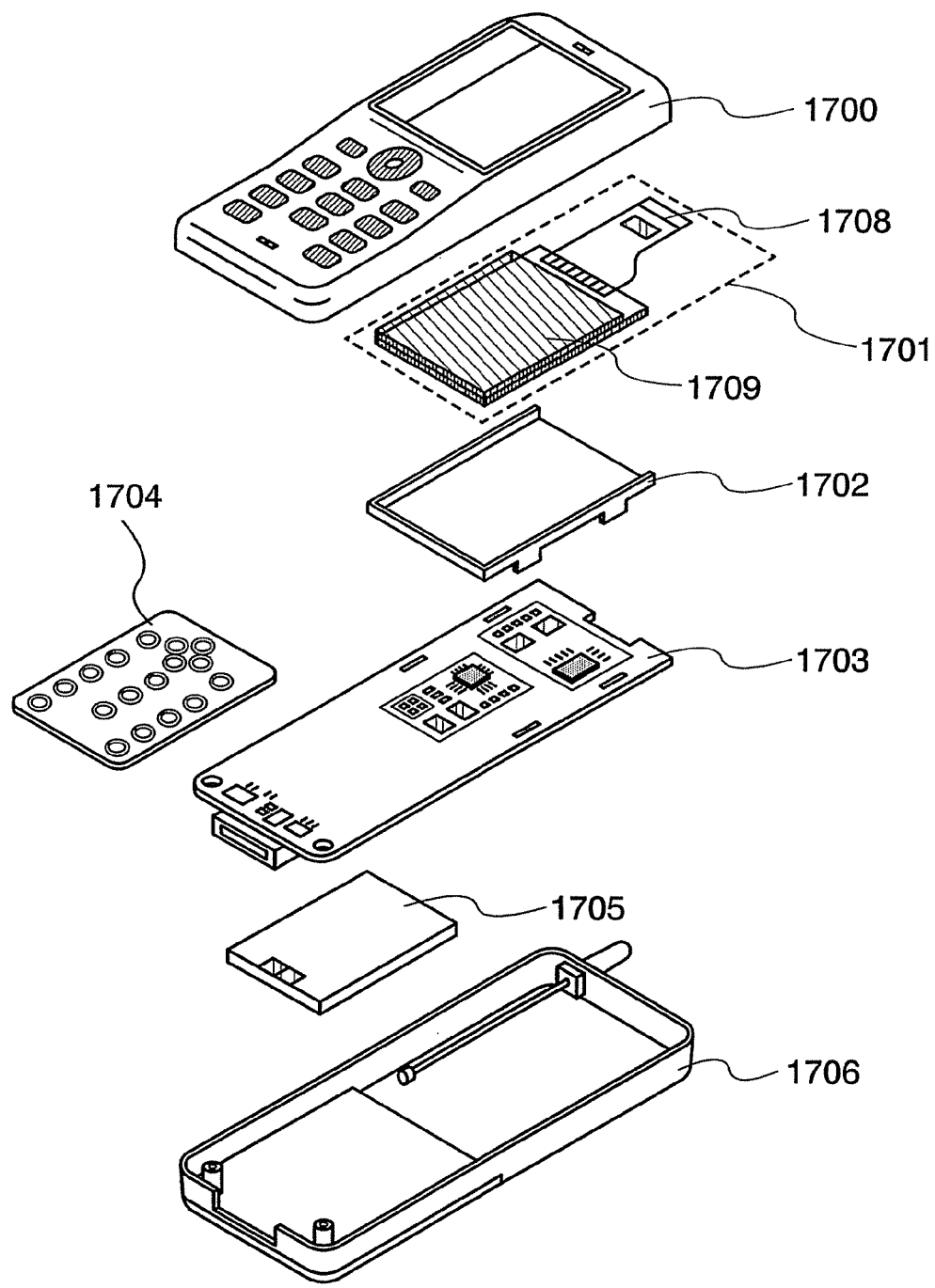
FIG. 19 is a view illustrating a mobile phone mounted with a semiconductor device of the present invention.

Next, one mode of the electronic devices on which the semiconductor device of the present invention is mounted will be described with reference to FIG. 19. The electronic device exemplified here is a cellular phone, which includes chassis 1700 and 1706, a panel 1701, a housing 1702, a printed wiring board 1703, operation buttons 1704, and a battery 1705. The panel 1701 is incorporated in the housing 1702 to be detachable, and the housing 1702 is fitted to the printed wiring board 1703. As for the housing 1702, a shape and a size thereof are appropriately changed depending on an electronic device in which the panel 1701 is incorporated. A plurality of semiconductor devices which are packaged are mounted on the printed wiring board 1703, and as one of the semiconductor devices, the semiconductor device having the memory element of the present invention can be used. A plurality of semiconductor devices mounted on the printed wiring board 1703 have any function of a controller, a central processing unit (CPU), a memory, a power supply circuit, an audio processing circuit, a transmitter/receiver circuit, or the like.

The panel 1701 is connected to the printed wiring board 1703 through a connection film 1708. The panel 1701, the housing 1702, and the printed wiring board 1703 are stored in the chassis 1700 and 1706 with the operation buttons 1704 and the battery 1705. A pixel region 1709 included in the panel 1701 is disposed so as to be visually recognized by an opening window provided in the chassis 1700.

As described above, the semiconductor device of the present invention has features of a small size, a thin shape, and lightweight. According to these features, limited space inside the chassis 1700 and 1706 of the electronic device can be used efficiently. Note that the chassis 1700 and 1706 are shown as one example of an appearance shape of a cellular phone, and the electronic device according to this embodiment can be changed to various modes in accordance with a function or an application thereof.

Note that a memory element of the present invention includes a first conductive layer, a memory layer, and a second conductive layer, and the memory layer is provided between the first conductive layer and the second conductive layer. Note that the memory layer contains nanoparticles of a conductive material each of which is coated with an organic thin film, and is formed by a droplet discharge method. Therefore, the memory element of the present invention can be manufactured simply with high yield.

Regarding the semiconductor device including such a memory element, data can be written to the memory element not only once but can also be written additionally. Since data once written to a memory element cannot be erased, it is possible to prevent forgery by rewriting. Therefore, a semiconductor device with excellent performance and reliability can be manufactured inexpensively.

Note that this embodiment mode can be combined with any of the other embodiment modes and embodiments as appropriate. For example, in a memory element included in the semiconductor device described in this embodiment mode, for example, an insulating layer or a semiconductor layer may be provided between a memory layer and at least one of a first conductive layer and a second conductive layer.

Embodiment 1

In this embodiment, a memory element is manufactured, in which a memory layer is formed from nanoparticles of a conductive material each of which is coated with an organic thin film, and a result of observing a change in structure due to writing to the memory element which is an example of the present invention will be described. The memory element is an element in which a first conductive layer, a memory layer, and a second conductive layer are sequentially stacked over a substrate. A method for manufacturing the memory element will be described with reference to FIG. 1. Note that the size of the memory element which was used is 5 µm square.

First, titanium was deposited over a substrate by a sputtering method to obtain a first conductive layer 110. Note that the film thickness was 100 nm.

Then, a memory layer 111 was formed to a thickness of 100 nm by a droplet discharge method while heating the substrate with a hot plate. A solution in which silver nanoparticles each of which is coated with an organic thin film are dispersed in water and a water-soluble organic solvent was used as a discharge material. Note that the concentration of silver in the solution is approximately 22.5 wt % (±2.5 wt %), and the grain diameter of the used nanoparticles is greater than or equal to 20 nm and less than or equal to 30 nm. Further, a discharge material having the viscosity of approximately 15 Pa·s at 25° C. and a surface tension of approximately 35 mN/m was used. First, the discharge material described above was discharged in the form of droplets onto the first conductive layer 110 while heating the substrate with a hot plate at 50° C., in addition, heating was performed using a hot plate at 80° C. for 10 minutes, and drying was performed; thus, the memory layer 111 formed from silver nanoparticles each of which was coated with an organic thin film was formed.

Then, aluminum was deposited to a thickness of 200 nm over the memory layer 111 by a vapor deposition method using resistance heating to form a second conductive layer 112.

Figure 20:
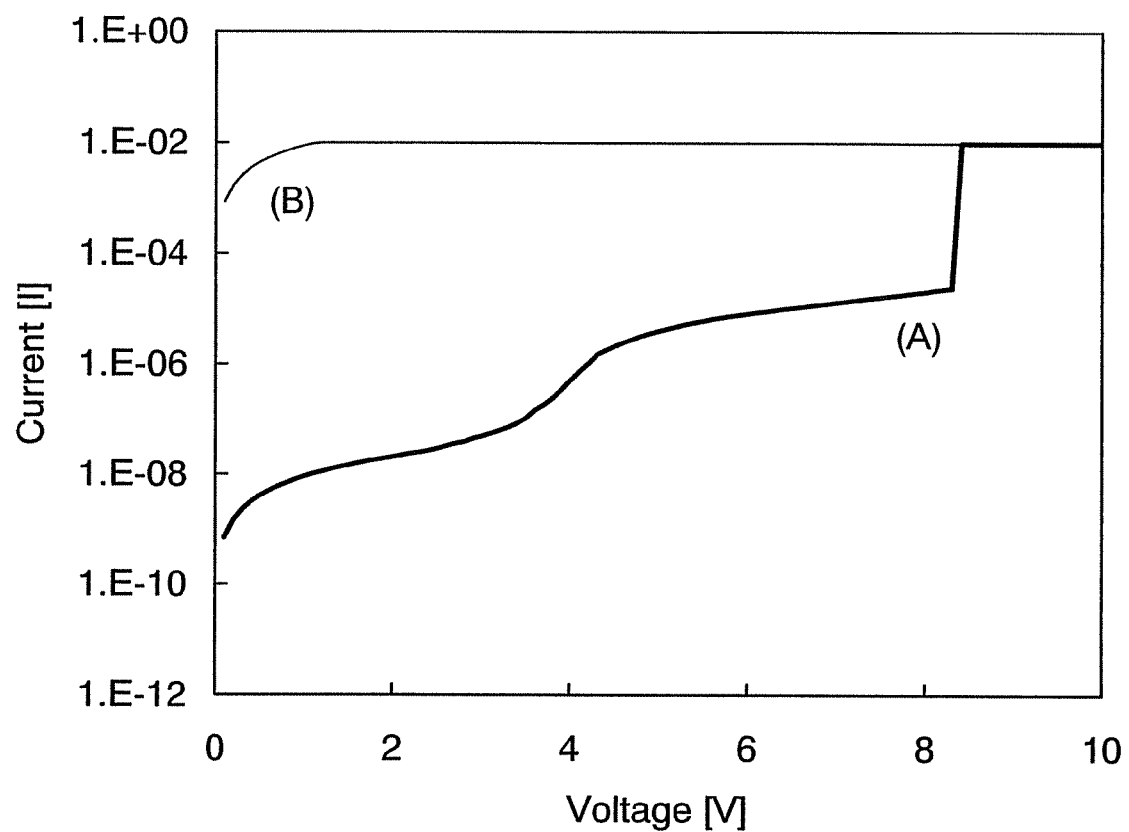
FIG. 20 is a graph showing voltage-current characteristics of a memory element manufactured in Embodiment 1.

Writing was performed by applying voltage to the memory element obtained as described above. A line (A) in FIG. 20 shows voltage-current characteristics of the memory element at the time of writing. A voltage was applied by a sweep method for continuously changing an applied voltage. A limit value of current flowing through the memory element was set to 10 mA, using a resistor. As shown in the line (A) in FIG. 20, a current value was increased at approximately 8.4 V, and the current value reached 10 mA which is a limit value. That is, it is found that electrodes are shorted and writing could be performed on the memory element.

Voltage-current characteristics of the memory element to which data had been written were examined by applying voltage again to this memory element by a sweep method. A line (B) in FIG. 20 shows the result thereof. As shown in the line (B) in FIG. 20, immediately after the voltage application, a value of current flowing through the memory element reached 10 mA which is a limit value. Thus, it was ensured that the electrodes had been already shorted and writing had been normally performed.

Figure 21:
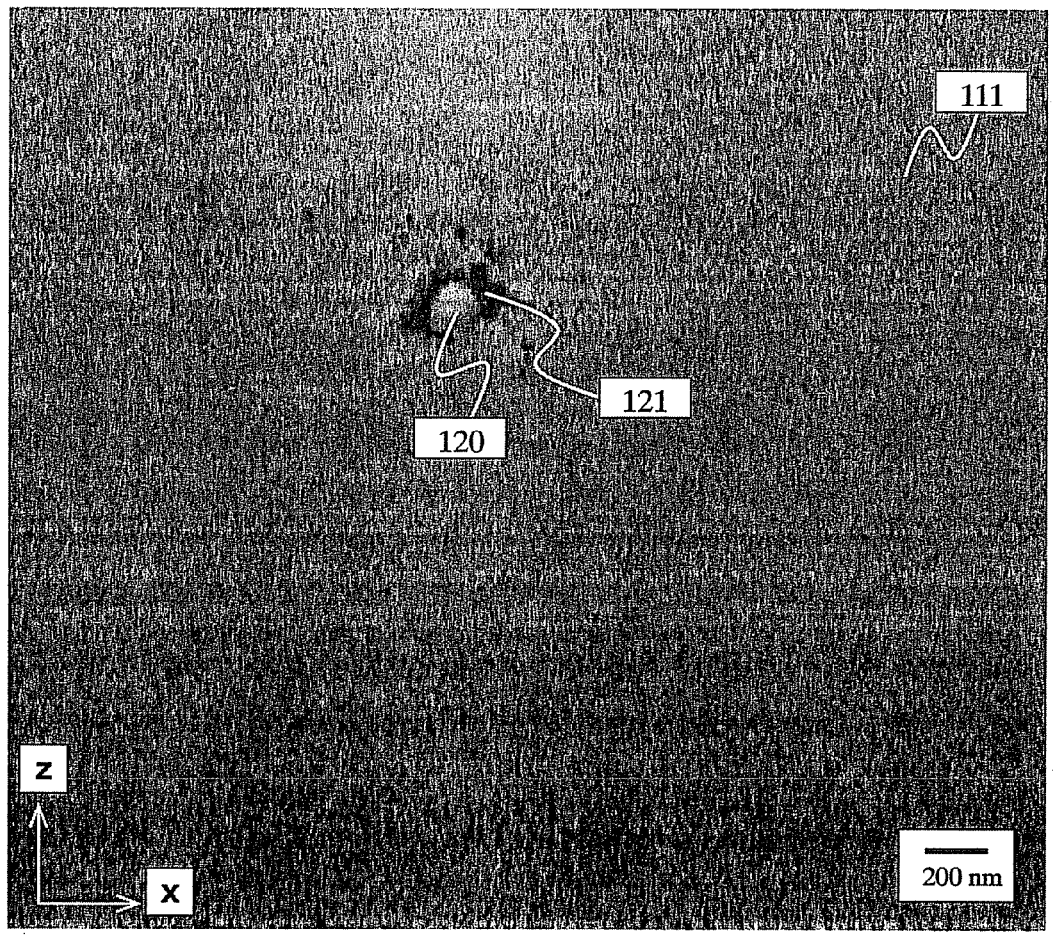
FIG. 21 is a photograph showing a cross section in a thickness direction of a memory layer of a memory element manufactured in Embodiment 1.
Figure 22:
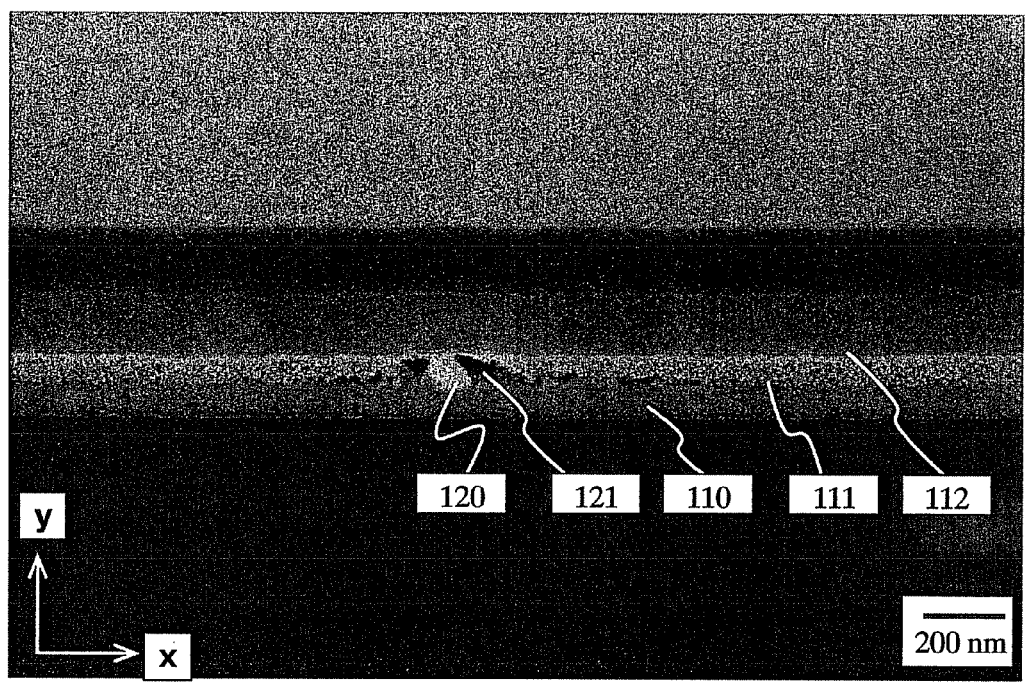
FIG. 22 is a photograph showing a cross section of a memory element manufactured in Embodiment 1.
Figure 23:
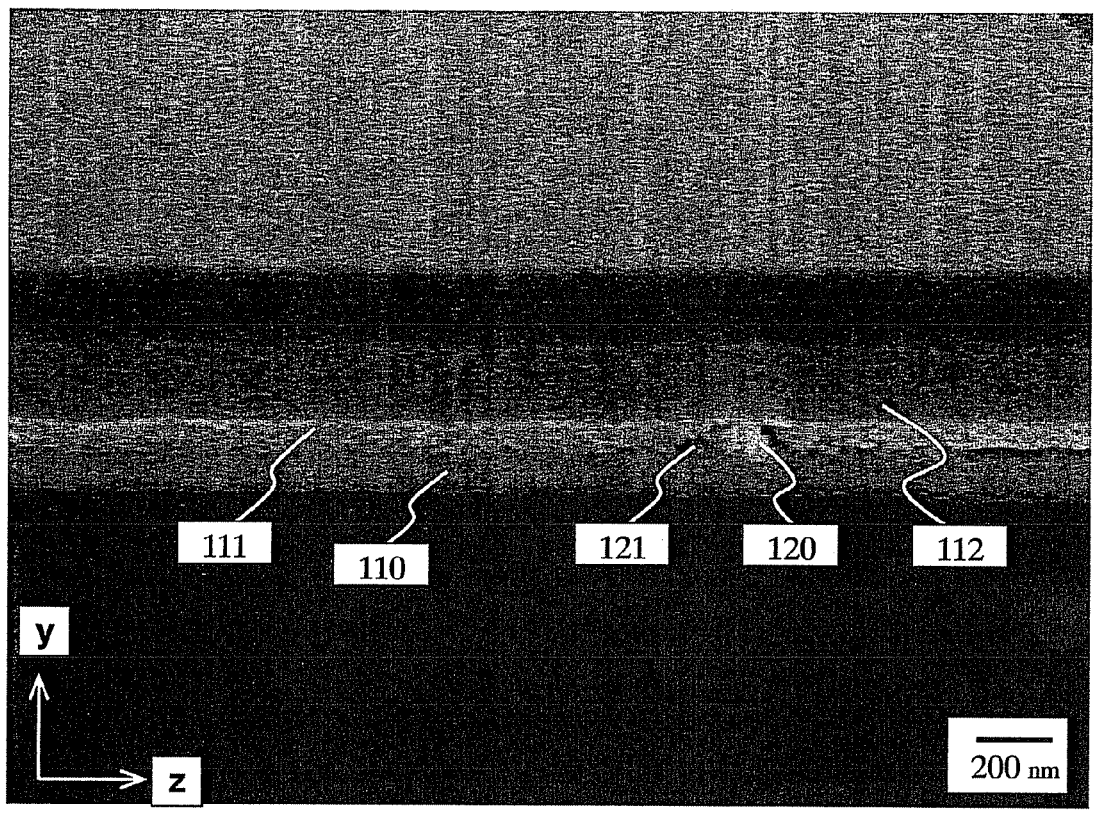
FIG. 23 is a photograph showing a cross section of a memory element manufactured in Embodiment 1.

FIGS. 21 to 23 are SEM photographs of the memory element to which data has been written as described above. FIG. 21 shows a cross section taken along a plane at half the thickness of the memory layer 111. When the thickness direction is assumed to be a y direction, FIG. 21 shows an x-z plane. FIG. 22 shows a section of the memory element, which shows an x-y plane. FIG. 23 also shows a section of the memory element, which shows a y-z plane.

FIGS. 21 to 23 show that a conductive portion 120 is formed by welding of nanoparticles due to writing. Further, it is found that writing can be performed by electrical connection between the first conductive layer 110 and the second conductive layer 112 with the conductive portion 120 interposed therebetween, and short of the memory element. Note that the conductive portion 120 was almost conical in shape. A space 121 is formed in the periphery of the conductive portion 120, and it is shown that the space 121 roughly depends on the shape of the conductive portion 120. In addition, over the first conductive layer 110, a space was also seen in a place other than the space 121. Furthermore, it is found that the second conductive layer 112 of the memory element to which data has been written is not deformed. Accordingly, for example in the case where another layer is provided over the second conductive layer 112, or the like, it is not necessary to concern about peeling of the layer, or the like.

A reliability test was carried out by exposing the memory element manufactured in this embodiment to an atmosphere at 85° C. for 240 hours. Even after 240 hours had passed, writing could be normally performed. Accordingly, it is found that the memory element of the present invention has high reliability.

Even after the memory element manufactured in this embodiment was heated with a hot plate at 150° C. for 16 hours, writing could be performed by applying voltage without short of the memory element.

The memory layer 111 of the memory element manufactured in this embodiment is dried with a hot plate at 80° C. after the discharge material is discharged in the form of droplets as described above. Alternatively, even when the memory layer 111 is dried with a hot plate at 140° C. for 10 minutes, writing characteristics similar to that in the case of drying at 80° C. are shown.

As described above, the memory element of the present invention can be manufactured simply with high yield.

Regarding the memory element of the present invention, data once written to the memory element cannot be erased. Thus, it is possible to prevent forgery by rewriting. Accordingly, a memory element with excellent performance and reliability can be manufactured inexpensively.

This application is based on Japanese Patent Application serial No. 2007-024862 filed with Japan Patent Office on Feb. 2, 2007, and Japanese Patent application serial No. 2007-024860 filed with Japan Patent Office on Feb. 2, 2007, the entire contents of which are hereby incorporated by reference.

What is claimed is:

1. A memory device comprising:
   a first conductive layer;
   a second conductive layer;
   a memory layer interposed between the first conductive layer and the second conductive layer, wherein:
      the memory layer includes a first portion and a second portion,
      wherein the second portion includes a composition and at least a nanoparticle including a first conductive material, wherein the nanoparticle is coated with an organic thin film, and provided into the composition, wherein the first portion comprises a second conductive material, the second conductive material is in electrical contact with the first conductive layer and the second conductive layer, and wherein the first portion and the second portion are in contact with the first conductive layer and the second conductive layer, a first partition wall and a second partition wall over the first conductive layer, the first partition wall and the second partition wall each having tapered shapes at its sides; and an insulating layer over the second conductive layer, the first partition wall and the second partition wall, wherein the memory layer is provided over the first conductive layer between the first partition wall and the second partition wall, wherein a side surface of the memory layer and a side surface of the second conductive layer are in contact with the side with the tapered shape of the first partition wall or the second partition wall, wherein a top of the first partition and a top of the second partition are over a top surface of the second conductive layer, wherein the insulating layer is in contact with a whole top surface of the second conductive layer and is in contact with the top of the first partition wall and the top of the second partition wall, and wherein the insulating layer is separated from the side surface of the second conductive layer by the first partition wall or the second partition wall.

2. The memory device according to claim 1, wherein a grain size of the nanoparticle is greater than or equal to 1 nm and less than or equal to 200 nm.

3. The memory device according to claim 1, wherein the organic thin film includes one of a surfactant, and a material forming a coordinate bond with the first conductive material.

4. The memory device according to claim 1, wherein the organic thin film includes a material selected from the group consisting of a surfactant, a material forming a coordinate bond with the first conductive material, a reducing agent, a binder, and a plasticizer.

5. The memory device according to claim 1, wherein the first portion is one of columnar and subulate in shape.

6. The memory device according to claim 1, wherein the first portion is not in contact with the second portion.

7. The memory device according to claim 1, further comprising an antenna over the memory layer, wherein the insulating layer is provided over and is in contact with the antenna.

8. The memory device according to claim 1, wherein the insulating layer is not in contact with the side surface of the memory layer.

9. The memory device according to claim 1, wherein the insulating layer is not in contact with the side surface of the second conductive layer.

10. The memory device according to claim 1,
wherein a surface of the first conductive layer which is in contact with the memory layer has a first wettability with respect to a fluid discharge material of the memory layer,
wherein surfaces of the first partition wall and the second partition wall which are not in contact with the first conductive layer have a second wettability with respect to a fluid discharge material of the memory layer, and
wherein the first wettability is higher than the second wettability.

11. A memory device comprising:
a first conductive layer;
a second conductive layer;
a memory layer interposed between the first conductive layer and the second conductive layer;
a transistor electrically connected to a memory element including the first conductive layer, the second conductive layer, and the memory layer, wherein:
the memory layer includes a first portion and a second portion,
wherein the second portion includes a composition and at least a nanoparticle including a first conductive material,
wherein the nanoparticle is coated with an organic thin film, and provided into the composition,
wherein the first portion comprises a second conductive material, the second conductive material is in electrical contact with the first conductive layer and the second conductive layer, and
wherein the first portion and the second portion are in contact with the first conductive layer and the second conductive layer,
a first partition wall and a second partition wall over the first conductive layer, the first partition wall and the second partition wall each having tapered shapes at its sides; and
an insulating layer over the second conductive layer, the first partition wall and the second partition wall,
wherein the memory layer is provided over the first conductive layer between the first partition wall and the second partition wall,
wherein a side surface of the memory layer and a side surface of the second conductive layer are in contact with the side with the tapered shape of the first partition wall or the second partition wall,
wherein a top of the first partition and a top of the second partition are over a top surface of the second conductive layer,
wherein the insulating layer is in contact with a whole top surface of the second conductive layer and is in contact with the top of the first partition wall and the top of the second partition wall, and
wherein the insulating layer is separated from the side surface of the second conductive layer by the first partition wall or the second partition wall.

12. The memory device according to claim 11, wherein a grain size of the nanoparticle is greater than or equal to 1 nm and less than or equal to 200 nm.

13. The memory device according to claim 11, wherein the organic thin film includes one of a surfactant, and a material forming a coordinate bond with the first conductive material.

14. The memory device according to claim 11, wherein the organic thin film includes a material selected from the group consisting of a surfactant, a material forming a coordinate bond with the first conductive material, a reducing agent, a binder, and a plasticizer.

15. The memory device according to claim 11, wherein the first portion is one of columnar and subulate in shape.

16. The memory device according to claim 11, wherein the first portion is not in contact with the second portion.

17. The memory device according to claim 11, further comprising an antenna over the memory layer, wherein the insulating layer is provided over and is in contact with the antenna.

* * * * *